United States Patent
Lau

(10) Patent No.: US 12,021,533 B2
(45) Date of Patent: Jun. 25, 2024

(54) CIRCUIT ARRANGEMENT AND METHOD OF FORMING THE SAME

(71) Applicant: Choon How Lau, Singapore (SG)

(72) Inventor: Choon How Lau, Singapore (SG)

( * ) Notice: Subject to any disclaimer, the term of this patent is extended or adjusted under 35 U.S.C. 154(b) by 175 days.

(21) Appl. No.: 17/617,077

(22) PCT Filed: Jun. 25, 2019

(86) PCT No.: PCT/SG2019/050315
§ 371 (c)(1),
(2) Date: Dec. 7, 2021

(87) PCT Pub. No.: WO2020/263175
PCT Pub. Date: Dec. 30, 2020

(65) Prior Publication Data
US 2022/0231674 A1     Jul. 21, 2022

(51) Int. Cl.
*H03K 5/01*         (2006.01)
*G01K 7/20*         (2006.01)
*H03F 3/04*         (2006.01)

(52) U.S. Cl.
CPC ............ *H03K 5/01* (2013.01); *G01K 7/20* (2013.01); *H03F 3/04* (2013.01)

(58) Field of Classification Search
CPC ................................................. H03K 5/01
(Continued)

(56) References Cited

U.S. PATENT DOCUMENTS

| | | | |
|---|---|---|---|
| 5,134,885 A | | 8/1992 | Hecht et al. |
| 5,795,069 A | * | 8/1998 | Mattes ............... G01K 7/25 374/E7.027 |

(Continued)

FOREIGN PATENT DOCUMENTS

| | | |
|---|---|---|
| CN | 202229863 U | 5/2012 |
| JP | 2015-175711 A | 10/2015 |

OTHER PUBLICATIONS

Ic-Haus, "iC-TW3 Sensor Signal Conditioner with Temperature Compensation and Line Driver", ic-Haus Datasheet, Rev B2, 2007, https://www.ichaus.com/infoletter, 26 pages.
(Continued)

*Primary Examiner* — Tomi Skibinski
(74) *Attorney, Agent, or Firm* — Brooks, Cameron & Huebsch, PLLC

(57) ABSTRACT

Various embodiments may provide a circuit arrangement. The circuit arrangement may include an adjustable resistor bridge configured to receive a driving signal from an electronic device, and further configured to generate one or more intermediate signals based on the driving signal. The circuit arrangement may also include an amplifier stage configured to generate an amplified signal based on the one or more intermediate signals, and a scaler configured to generate an output signal based on the amplified signal. The adjustable resistor bridge may include at least one resistor of a first resistor type having a first coefficient of resistance with respect to an environmental condition, and at least one resistor of a second resistor type having a second coefficient of resistance with respect to the environmental condition different from the first coefficient. A resistance of the first resistor type may be adjustable by a resistor stage digital control signal.

19 Claims, 22 Drawing Sheets

(58) Field of Classification Search
USPC .......................................................... 327/306
See application file for complete search history.

(56) References Cited

U.S. PATENT DOCUMENTS

| | | |
|---|---|---|
| 7,857,505 B2 | 12/2010 | Sakima et al. |
| 8,390,363 B2 | 3/2013 | Engl |
| 9,739,669 B2 | 8/2017 | Susak et al. |
| 2009/0237151 A1 | 9/2009 | Yoshida et al. |
| 2016/0116346 A1 | 4/2016 | Aliane et al. |

OTHER PUBLICATIONS

Toshiba, "TC7MTX01FK Digital Temperature Compensation IC", Toshiba Datasheet, 2002, www.datasheetcatalog.com, 17 pages.
Renesas, "ISL21400 Programmable Temperature Slope Voltage Reference", Renesas Application Note AN1446, Jan. 16, 2009, http://www.renesas.com, 19 pages.
Wojslaw, "Everything You Wanted to Know About Digital Potentiometers", Copal Electronics Application Note AN8, Publication No. 6009, Revision A, Oct. 17, 2001, www.copal-electronics.com, 8 pages.
Kozomora, et al., "Sensor Temperature Compensation", Allegro Microsystems Application Note AN296122, 2016, www.allegromicro.com, 7 pages.
Kester, "Bridge Circuits", Practical Design Techniques for Sensor Signal Conditioning, Analog Devices, Inc., ISBN-0-916550-20-6, 1999, http://www.analog.com, 366 pages.
International Search Report and Written Opinion from related PCT Application No. PCT/SG2019/050315 dated Jun. 26, 2019, 9 pages.

\* cited by examiner

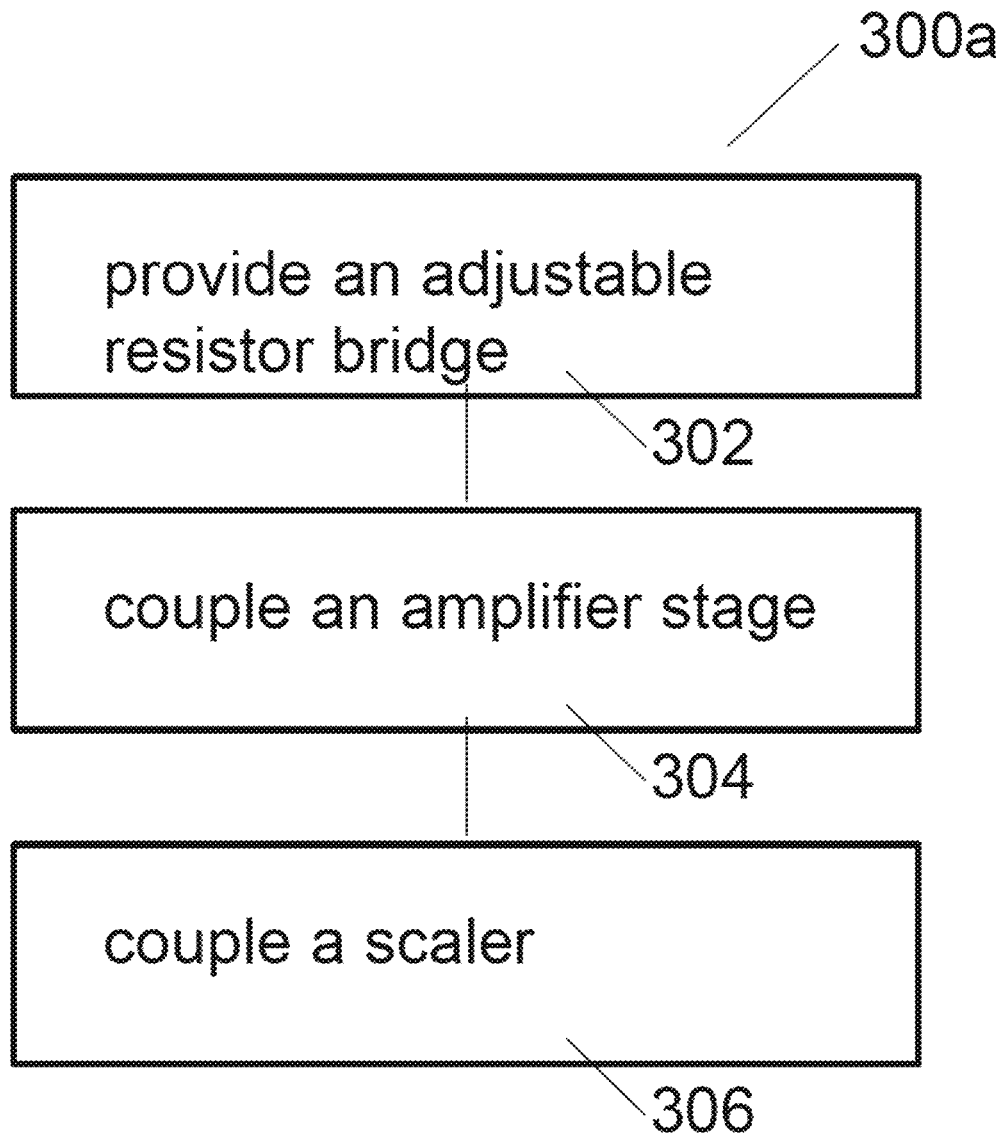

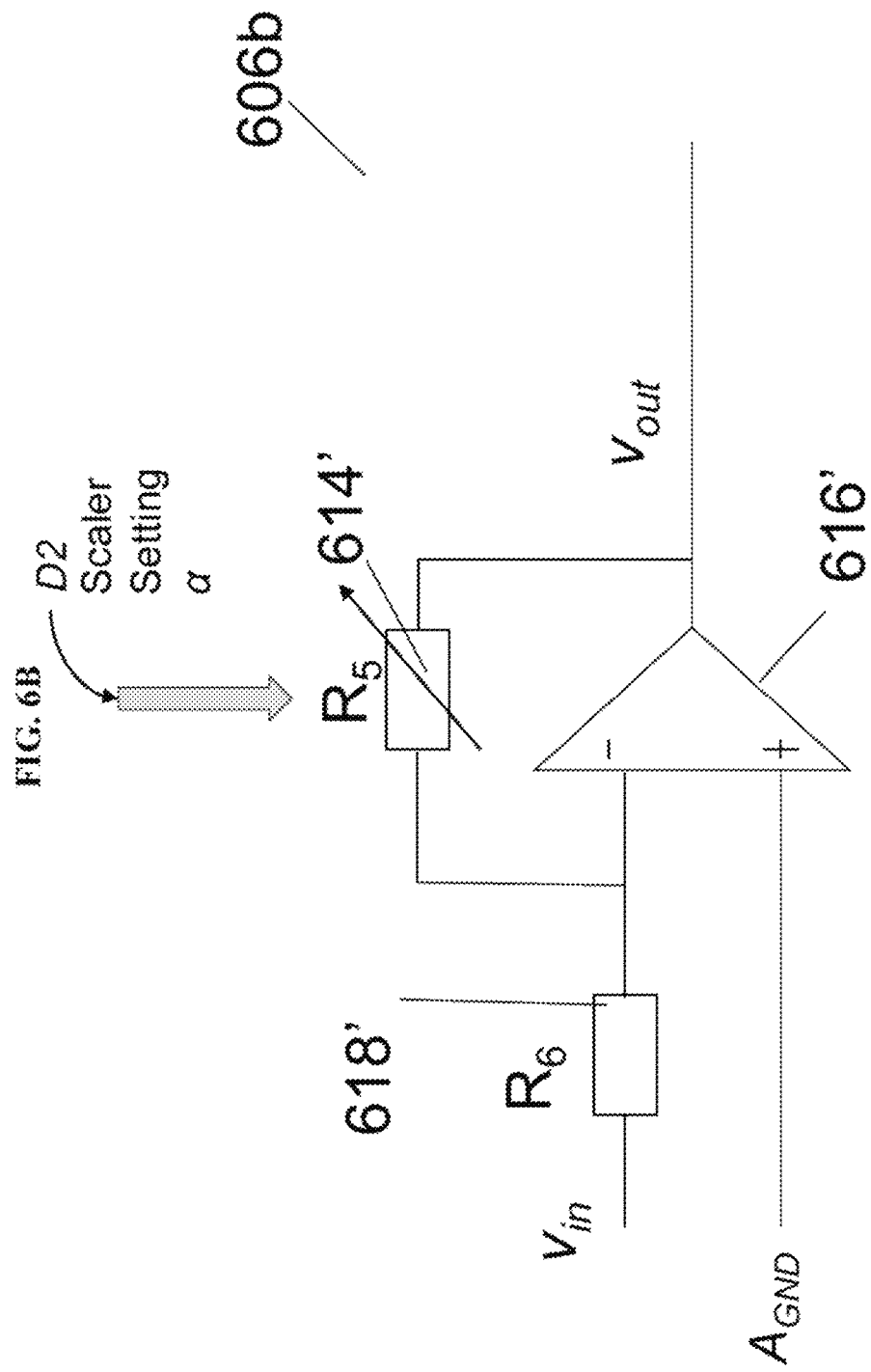

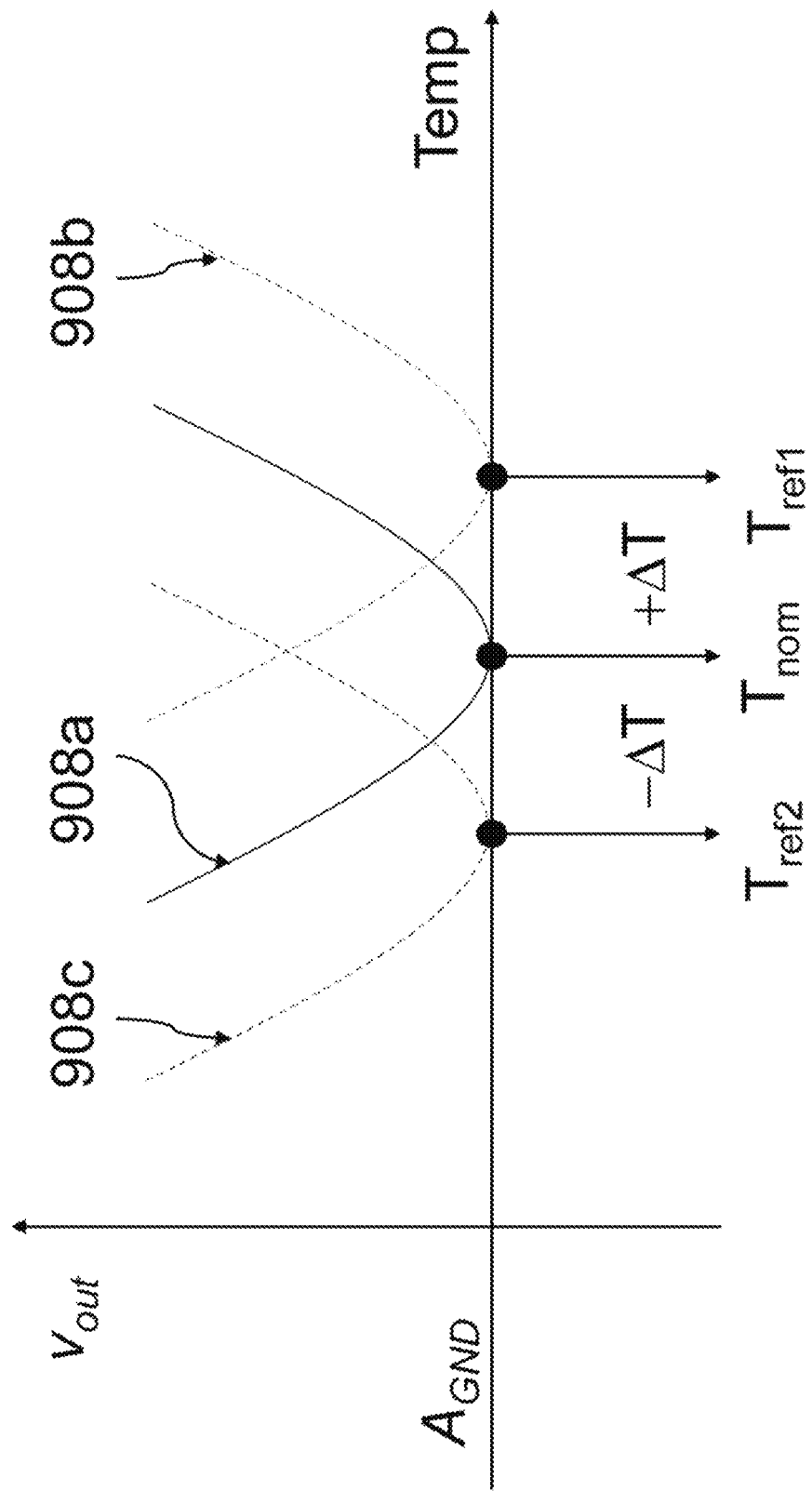

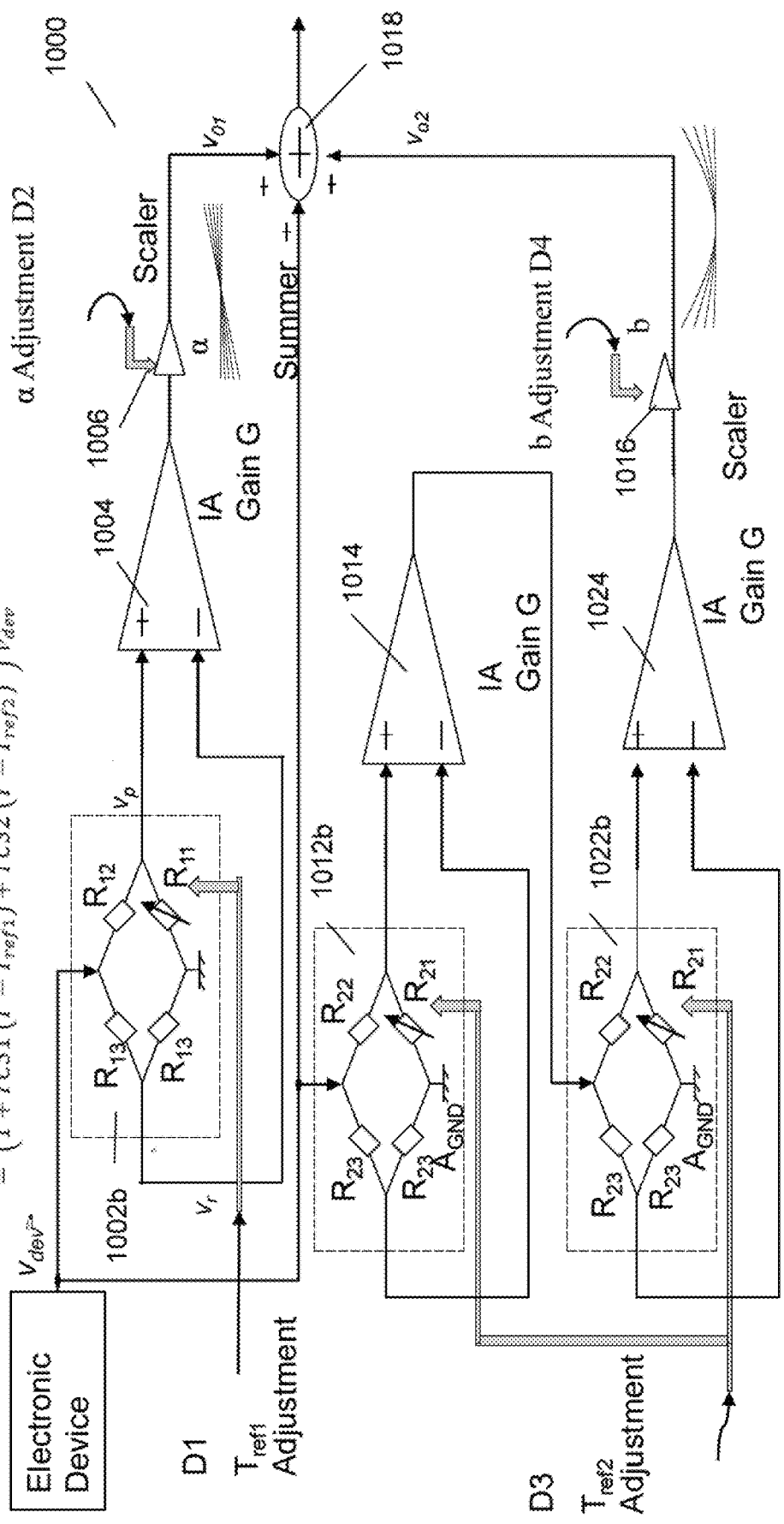

FIG. 12

$$v_{out} = \left(1 + TCS1(T - T_{ref1}) + TCS2(T - T_{ref2})^2\right)v_{dev} + \left(1 + TCO1(T - T_{ref3}) + TCO2(T - T_{ref4})^2\right)V_{offset}$$

$$D_{out} = 2^N \frac{v_{in}}{V_{ref}}$$

$$D_{out} = 2^N \frac{v_{in}\left(1 + TCS1_{vin}(T - T_{01vin}) + TCS2_{vin}(T - T_{02vin})^2\right)}{V_{ref}\left(1 + TCS1_{vref}(T - T_{01vref}) + TCS2_{vref}(T - T_{02vref})^2\right)}$$

CIRCUIT ARRANGEMENT AND METHOD OF FORMING THE SAME

TECHNICAL FIELD

Various aspects of this disclosure relate to a circuit arrangement. Various aspects of this disclosure relate to a method of forming a circuit arrangement.

BACKGROUND

Many electronic devices generate an analogue output voltage $v_{out}$ that is dependent on temperature T. The relationship between the output voltage and the temperature may be provided by:

$$v_{out} = Q_{in} \frac{\partial v_{out}}{\partial Q_{in}} (1 + TCS1(T - T_{ref}) + TCS2(T - T_{ref})^2) + v_{offset}(1 + TCO1(T - T_{ref}) + TCO2(T - T_{ref})^2) \quad (1)$$

$$\frac{\partial v_{out}}{\partial Q_{in}}$$

is the device transfer function in which $Q_{in}$ denotes the input to the device. The quadratic dependence of $v_{out}$ may be described by four parameters TCS1, TCS2, TCO1, and TCO2. TCS1 is the first-order temperature coefficient of sensitivity (TCS) that describes the linear dependence of the device transfer function on temperature T. TCS2 is the second-order temperature coefficient of sensitivity that describes the dependence of the device transfer function on $T^2$. TCO1 is the first-order temperature coefficient of offset (TCO) that describes the linear dependence of the device output offset on temperature. TCO2 is the second-order temperature coefficient of offset that describes the dependence of the device output offset on $T^2$. $T_{ref}$ denotes the zero-reference temperature point at which the temperature effects on $v_{out}$ are zero.

In an ideal measurement setup, $v_{out}$ should be solely dependent on input $Q_{in}$, and unaffected by environmental factors, such as ambient temperature. In order to minimize temperature dependency, dedicated electronic circuitry may be employed to zero out the temperature dependence of the output signal $v_{out}$.

FIG. 1 shows a conventional temperature adjustment circuit. The temperature adjustment data for sensitivity and offset may be pre-stored in a memory device 102a. Temperature sensor 102b measures the ambient temperature, and based on the ambient temperature measurements, different adjustment data are read out from the memory device under the direction of a sequencer 102c. The adjustment data read out from the temperature controller is used to control a plurality of resistors and switches 104, 106 to set predetermined target resistor values $R_1$ and $R_2$.

The method employed may be commonly referred to as a temperature look-up table adjustment where any arbitrary temperature characteristics may be approximated by straight lines between multiple predetermined temperature points. By expanding the number of entries in the memory look-up table to include more temperature points, the accuracy of the approximation may be improved at the expense of memory storage.

Variants of using temperature look-up tables have been proposed to improve accuracy of approximation without a substantial penalty in memory utilization. However, a look-up table-based method for adjustment has the following drawbacks:

1. The pre-stored temperature adjustment data required for the look-up table incurs a penalty in the size of the memory capacity of memory device needed in direct proportion to the accuracy of the temperature adjustment required.
2. In the conventional devices, a first or higher order adjustment of TCS would incur a substantial penalty in memory storage.
3. Although a first order TCO adjustment may be carried out accurately without incurring a substantial penalty in memory capacity, the adjustment methods cannot be extended to a second or higher order of TCO without incurring a substantial penalty in memory storage.
4. The output of the temperature sensor controller needs to be calibrated before use.

SUMMARY

Various embodiments may provide a circuit arrangement. The circuit arrangement may include an adjustable resistor bridge configured to receive one or more driving signals from an electronic device, and further configured to generate one or more intermediate signals based on the one or more driving signals. The circuit arrangement may also include an amplifier stage configured to generate an amplified signal based on the one or more intermediate signals. The circuit arrangement may further include a scaler configured to generate an output signal based on the amplified signal. The adjustable resistor bridge may include at least one resistor of a first resistor type having a first coefficient of resistance with respect to an environmental condition. The adjustable resistor bridge may include at least one resistor of a second resistor type having a second coefficient of resistance with respect to the environmental condition different from the first coefficient. A resistance of the at least one resistor of the first resistor type may be adjustable by a resistor stage digital control signal.

Various embodiments may provide a method of forming a circuit arrangement. The method may include providing an adjustable resistor bridge configured to receive a driving signal from an electronic device, and further configured to generate one or more intermediate signals based on the driving signal. The method may also include coupling an amplifier stage, such that the amplifier stage is configured to generate an amplified signal based on the one or more intermediate signals. The amplifier stage may be coupled to the adjustable resistor bridge. The method may additionally include coupling a scaler such that the scaler is configured to generate an output signal based on the amplified signal. The scaler may be coupled to the amplifier stage. The adjustable resistor bridge may include at least one resistor of a first resistor type having a first coefficient of resistance with respect to an environmental condition. The adjustable resistor bridge may include at least one resistor of a second resistor type having a second coefficient of resistance with respect to the environmental condition different from the first coefficient. A resistance of the at least one resistor of the first resistor type may be adjustable by a resistor stage digital control signal.

BRIEF DESCRIPTION OF THE DRAWINGS

The invention will be better understood with reference to the detailed description when considered in conjunction with the non-limiting examples and the accompanying drawings, in which:

FIG. 3A is a general illustration of a method of forming a circuit arrangement according to various embodiments.

FIG. 6B is a schematic showing another adjustable scaler according to various embodiments.

FIG. 9D is a plot of output voltage ($v_{out}$) as a function of temperature (T) illustrating how the relationship between the output voltage and temperature varies by changing resistor value $R_1$ in both the resistor bridges of the circuit arrangement shown in FIG. 7 according to various embodiments.

FIG. 10 shows a circuit arrangement according to various embodiments for realizing a quadratic temperature coefficient of sensitivity adjustment for the bridge driving signal $v_{dev}$.

FIG. 12 shows a circuit arrangement according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or circuit arrangements are analogously valid for the other methods or circuit arrangements. Similarly, embodiments described in the context of a method are analogously valid for a circuit arrangement, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Figure 1:
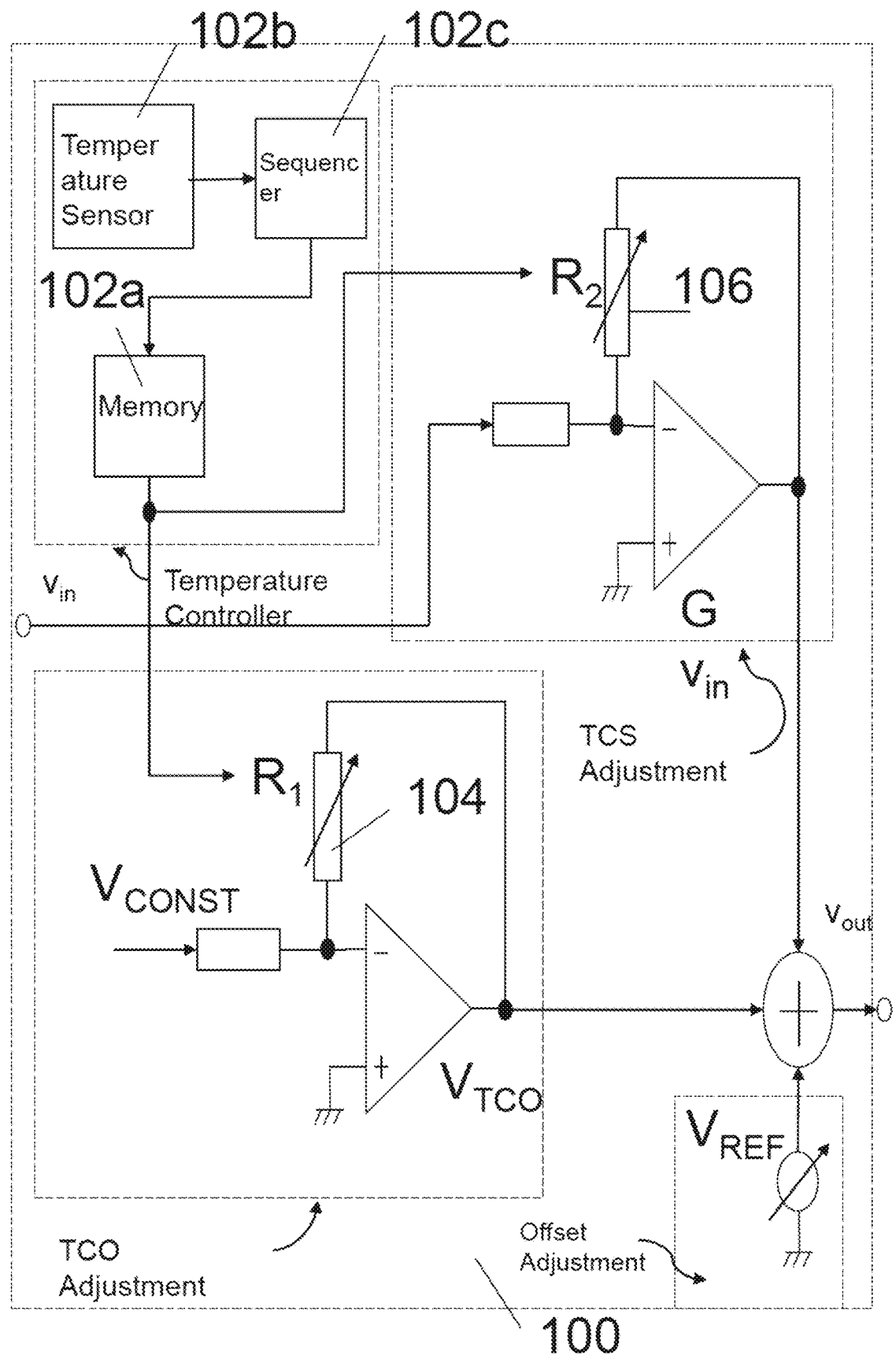
FIG. 1 shows a conventional temperature adjustment circuit.
Figure 2:
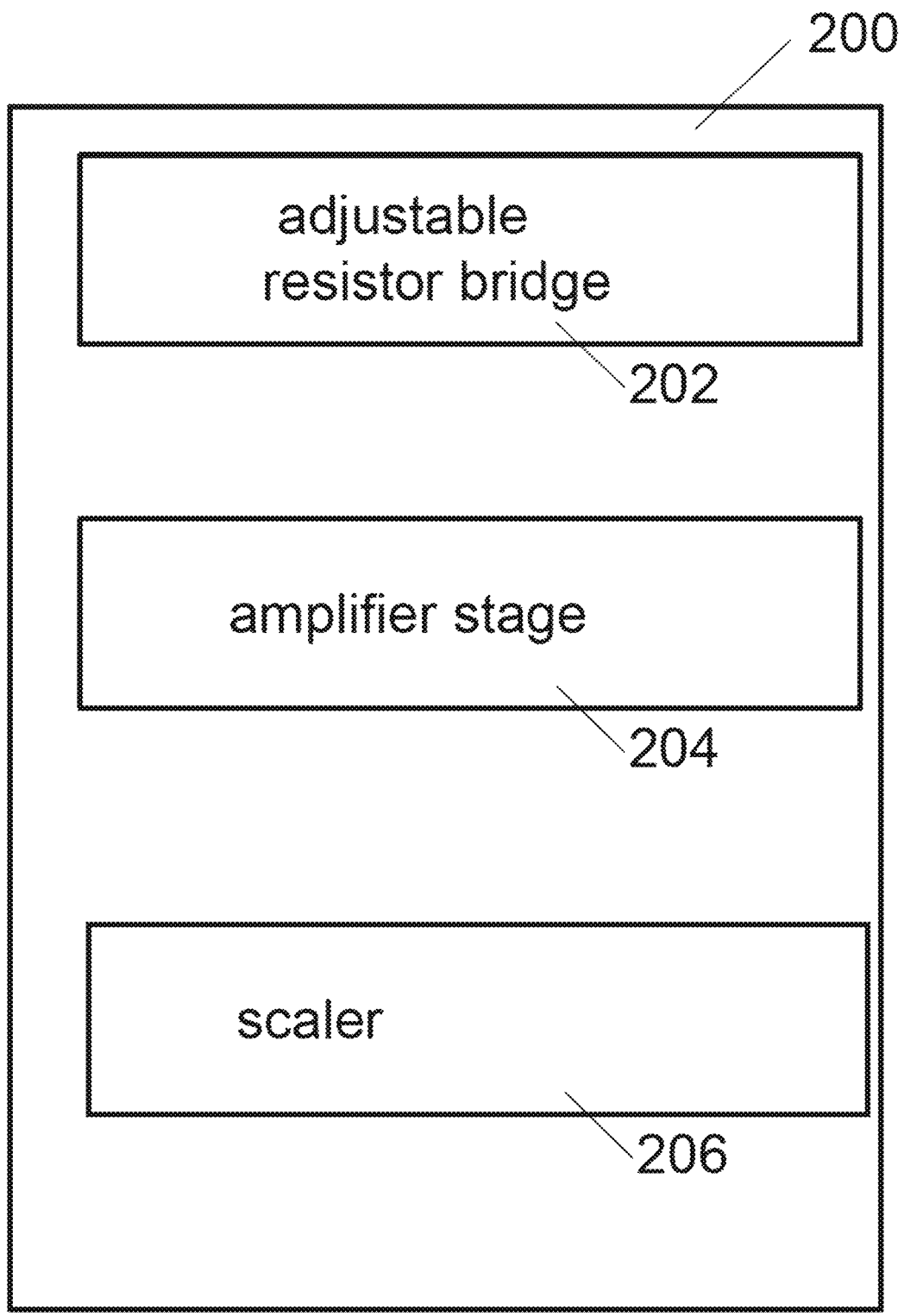
FIG. 2 is a general illustration of a circuit arrangement according to various embodiments.

FIG. 2 is a general illustration of a circuit arrangement 200 according to various embodiments. The circuit arrangement 200 may include an adjustable resistor bridge 202 configured to receive one or more driving signals (also referred to as a bridge driving signals) from an electronic device, and further configured to generate one or more intermediate signals based on the one or more driving signals. The circuit arrangement 200 may also include an amplifier stage 204 configured to generate an amplified signal based on the one or more intermediate signals. The circuit arrangement 200 may further include a scaler 206 configured to generate an output signal based on the amplified signal. The adjustable resistor bridge 202 may include at least one resistor of a first resistor type having a first coefficient of resistance with respect to an environmental condition. The adjustable resistor bridge 202 may include at least one resistor of a second resistor type having a second coefficient of resistance with respect to the environmental condition different from the first coefficient. A resistance of the at least one resistor of the first resistor type may be adjusted or adjustable by a resistor stage digital control signal.

The adjustable resistor bridge 202 may advantageously acts as a sensing means while at the same time play a role in adjustment of the output signal based on the environmental condition sensed. The amplifier stage 204 may be an instrumentation amplifier stage or variants thereof.

The environmental condition may also be referred to as a parameter. The environment condition may be any one selected from a group consisting of temperature, a voltage of the driving signal, intensity of incident radiation (e.g. light or any other suitable type of electromagnetic wave), magnetic field strength, mechanical strain, and humidity. The environmental condition may not be limited to the above-mentioned examples, but may be any other suitable environmental condition.

In various embodiments, the second resistor type may have zero dependency on the environmental condition. The second coefficient of resistance with respect to the environmental condition may be zero.

In various other embodiments, both the first resistor type and the second resistor type may be dependent (but with different dependencies) on the environmental condition. The resistance of the at least one resistor of the second resistor type may not be adjustable.

In various embodiments, the adjustable resistor bridge 202 may be a single-ended bridge.

In various embodiments, the adjustable resistor bridge 202 may include an adjustable first branch including a resistor of the at least one resistor of the first resistor type and a resistor of the at least one resistor of the second resistor type in serial connection with each other. The adjustment of the adjustable first branch of the single-ended resistor bridge may be carried out by means of the digital control word of one or more bits. The adjustable resistor bridge 202 may also include a second branch connected in parallel to the adjustable first branch. In various embodiments, the second branch may include further two resistors of the at least one resistor of the second resistor type in serial connection with each other. In various embodiments, a driving signal of the one or more driving signals may be received by a connection point connecting the adjustable first branch and the second branch. An opposing connection point connecting the adjustable first branch and the second branch may be configured to be biased by a reference voltage, e.g. ground. In various other embodiments a first driving signal of the one or more driving signals may be received by a first connection point connecting the adjustable first branch and the second branch, and a second driving signal of the one or more driving signals may be received by a second connection point connecting the adjustable first branch and the second branch (i.e. differential signal driving). The adjustable single-ended bridge may be configured to generate a first intermediate signal of the one or more intermediate signals at a further connection point connecting the resistor of the first resistor type included in the adjustable first branch, and the resistor of the second resistor type included in the adjustable first branch. The adjustable single-ended bridge may be configured to generate a second intermediate signal of the one or more intermediate signals at another connection point connecting the further two resistors of the second resistor type included in the second branch.

In various other embodiments, the second branch may include further two resistors of a third resistor type in serial connection with each other. Each of the two resistors of the third resistor types may have a third coefficient of resistance with respect to the environmental condition different from the first coefficient of resistance and different from the second coefficient of resistance. In this regard, the adjustable single-ended bridge may be configured to generate a second intermediate signal of the one or more intermediate signals at another connection point connecting the further two resistors of the third resistor type included in the second branch. The adjustable first branch parallel to the second branch may include a resistor of the at least one resistor of the first resistor type and a resistor of the at least one resistor of the second resistor type in serial connection with each other, as highlighted above. The resistance of the at least one resistor of the third resistor type may not be adjustable.

In various embodiments, the adjustable resistor bridge 202 may be a differential bridge.

The adjustable resistor bridge 202 may include an adjustable first branch including a resistor of the at least one resistor of the first resistor type and a resistor of the at least one resistor of the second resistor type in serial connection with each other. The adjustable resistor bridge 202 may also include an adjustable second branch connected in parallel to the first branch, the adjustable second branch including a further resistor of the at least one resistor of the first resistor type and a further resistor of the at least one resistor of the second resistor type in serial connection with each other. The resistor stage digital control signal providing adjustment to the adjustable resistor bridge 202 may be a common digital control word of one or more bits providing adjustment to both the adjustable first branch and the adjustable second branch. In various embodiments, a first driving signal of the one or more driving signals may be received by a first connection point connecting the first branch and the second branch, and a second driving signal of the one or more driving signals may be received by a second connection point connecting the first branch and the second branch (i.e. differential signal driving). In various other embodiments, a driving signal of the one or more driving signals may be received by a connection point connecting the first branch and the second branch. An opposing connection point connecting the first branch and the second branch may be configured to be biased by a reference voltage, e.g. ground. The adjustable differential bridge may be configured to generate a first intermediate signal of the one or more intermediate signals at a further connection point connecting the resistor of the first resistor type included in the first branch, and the resistor of the second resistor type included in the first branch. The adjustable differential bridge may be configured to generate a second intermediate signal of the one or more intermediate signals at another connection point connecting the further resistor of the first resistor type, and the further resistor of the second resistor type included in the second branch.

In theory, all resistors of the first resistor type may have a coefficient of resistance identical to each other or one another. Similarly, all resistors of the second resistor type may have a coefficient of resistance identical to each other or one another, and all resistors of the third resistor type may have a coefficient of resistance identical to each other or one another. However, in practice, it may be difficult to ensure that all resistors of one resistor type have identical coefficient of resistance. In practice, one resistor of one resistor type may have a coefficient of resistance 1% higher or lower than another resistor of the same resistor type.

The resistance of the at least one resistor of the first resistor type may be adjustable so that a relationship between the output signal and the environmental condition is adjustable.

In various embodiments, the circuit arrangement may include a digital control word line connected to each resistor of the first resistor type.

The adjustable resistor bridge 202 may be configured such that the output signal varies in response to the environmental condition. The resistors forming the bridge 202 may have no dependence or low dependence on other environmental conditions, i.e. the coefficients of resistance in relation to these other environmental conditions may be zero or may have a low value.

In various embodiments, the scaler 206 may be an adjustable scaler adjustable by a scaler digital control signal. The adjustable scaler may be a digital potentiometer.

In various embodiments, the amplifier stage 204 may include an instrumentation amplifier configured to receive a first intermediate signal of the one or more intermediate signals from the adjustable resistor bridge 202. The instrumentation amplifier may be further configured to receive a second intermediate signal of the one or more intermediate signals from the adjustable resistor bridge 202. The instrumentation amplifier may have an output configured to generate the amplified signal based on the difference between the first and second intermediate signals.

In various embodiments, the amplifier stage 204 may include a voltage follower having an input configured to receive a first intermediate signal of the one or more intermediate signals from the resistor bridge 202, and an output configured to generated an unity signal based on the first intermediate signal. The voltage follower may act as a buffer. The amplifier stage 204 may also include a differential amplifier having a first input connected to the output of the voltage follower and configured to receive the unity signal, a second input connected to the resistor bridge 202 and configured to receive a second intermediate signal of the one or more intermediate signals from the resistor bridge 202, and an output configured to generate a gain signal based on the unity signal and the second intermediate signal. The amplifier stage 204 may additionally include a summer having a first input connected to the output of the voltage follower and configured to receive the unity signal, a second input connected to the output of the differential amplifier and configured to receive the gain signal, and an output configured to generate the amplified signal based on the unity signal and the gain signal. In various other embodiments, the amplifier stage 204 may include an operational amplifier (op-amp), a resistive feedback network coupled to the operational amplifier, and an input operational amplifier coupled to the resistive feedback network. The input operational amplifier may be configured to generate a temperature dependent signal based on the intermediate signals. The operational amplifier and the resistive feedback network may be configured to generate the amplified signal based on the temperature dependent signal.

The circuit arrangement 200 may further include a further adjustable resistor bridge configured to receive the amplified signal, and further configured to generate one or more further intermediate signals based on the amplified signal. The circuit arrangement 200 may also include a further amplifier stage configured to generate a further amplified signal based on the one or more further intermediate signals. The scaler may be configured to generate the output signal based on the further amplified signal. Various embodiments may achieve a higher order of dependence on the environmental condition, e.g. temperature by series connection of more than one matching adjustable resistor bridge. In various embodiments, a quadratic adjustment with the environment may be realized for any analogue electronic device. The further amplifier stage may be a further instrumentation amplifier stage or variants thereof. The scaler may be an adjustable scaler.

In various embodiments, the circuit arrangement 200 may also include a further adjustable resistor bridge configured to receive the amplified signal, and further configured to generate one or more further intermediate signals based on the amplified signal. The circuit arrangement 200 may also include a further amplifier stage configured to generate a further amplified signal based on the one or more further intermediate signals. The circuit arrangement 200 may additionally include a further scaler configured to generate a second order correction signal based on the further amplified signal. The circuit arrangement 200 may also include a summer having a first input configured to receive the amplified signal from the adjustable resistor bridge, a second input configured to receive the second order correction signal from the further scaler, and an output configured to generate a summed signal based on the amplified signal and the second order correction signal. The adjustable scaler 306 may be configured to generate the output signal based on the summed signal. Various embodiments may remove or substantially remove the nonlinearity in approximate first-order dependence of the driving signal on the environmental condition, e.g. temperature. Various embodiments may provide a first-order dependence on the environmental condition with improved linearity. The further amplifier stage may be a further instrumentation amplifier stage or variants thereof. The further scaler may be a further adjustable scaler.

In various other embodiments, the circuit arrangement 200 may also include a further adjustable resistor bridge configured to receive the driving signal, and further configured to generate one or more further intermediate signals based on the driving signal. The circuit arrangement 200 may further include a further amplifier stage configured to generate a further amplified signal based on the one or more further intermediate signals. The circuit arrangement 200 may also include another adjustable resistor bridge configured to receive the further amplified signal, and further configured to generate one or more other intermediate signals based on the further amplified signal. The circuit arrangement 200 may additionally include another amplifier stage configured to generate another amplified signal based on the one or more other intermediate signals. The circuit arrangement 200 may also include a further scaler configured to generate a further output signal based on the other amplified signal. The circuit arrangement may further include a summer configured to generate a summed signal based on the output signal, the further output signal, and the driving signal. The further amplifier stage may be a further instrumentation amplifier stage or variants thereof. The other amplifier stage may be another instrumentation amplifier stage or variants thereof. The further scaler may be a further adjustable scaler.

The adjustable resistor bridge 202 may be adjusted or adjustable by a first resistor stage digital control signal. The further adjustable resistor bridge and the other adjustable resistor bridge may be adjusted or adjustable by a second resistor stage digital control signal. The adjustable scaler may be adjusted or adjustable by a first scaler digital control signal. The further adjustable scaler may be adjusted or adjustable by a second scaler digital control signal.

In various other embodiments, the circuit arrangement 200 may additionally include a further adjustable resistor bridge configured to receive a constant direct current (DC) signal, and further configured to generate one or more further intermediate signals based on the constant direct current (DC) signal. The circuit arrangement 200 may also include a further amplifier stage configured to generate a further amplified signal based on the one or more further intermediate signals. The circuit arrangement 200 may also include a further scaler configured to generate a further output signal based on the further amplified signal. The circuit arrangement 200 may also include a summer configured to generate a summed signal based on the driving signal, the output signal, and the further output signal. The further amplifier stage may be a further instrumentation amplifier stage. The further scaler may be a further adjustable scaler.

The adjustable resistor bridge 202 may be adjusted or adjustable by a first resistor stage digital control signal. The further adjustable resistor bridge may be adjusted or adjustable by a second resistor stage digital control signal. The scaler may be adjusted or adjustable by a first scaler digital control signal. The further scaler may be adjusted or adjustable by a second scaler digital control signal.

In various other embodiments, the circuit arrangement 200 may also include a further first adjustable resistor bridge configured to receive the driving signal, and further configured to generate one or more further first intermediate signals based on the driving signal. The circuit arrangement 200 may also include a further first amplifier stage configured to generate a further first amplified signal based on the one or more further first intermediate signals. The further first amplifier stage may be a further first instrumentation amplifier stage.

The circuit arrangement 200 may also include a further second adjustable resistor bridge configured to receive the further first amplified signal, and further configured to generate one or more further second intermediate signals based on the further first amplified signal. The circuit arrangement 200 may also include a further second amplifier stage configured to receive the one or more further second intermediate signals, and generate a further second amplified signal based on the one or more further second intermediate signals. The circuit arrangement 200 may additionally include a further first scaler configured to generate a further first output signal based on the further second amplified signal. The circuit arrangement 200 may also include a first summer configured to generate a first summed signal based on the output signal, the further first output signal, and the driving signal. The further second amplifier stage may be a further second instrumentation amplifier stage. The further first scaler may be a further first adjustable scaler.

The circuit arrangement 200 may further include a further third adjustable resistor bridge configured to receive a constant direct current (DC) signal, and further configured to generate one or more further third intermediate signals based on the constant direct current (DC) signal. The circuit arrangement 200 may also include a further third amplifier stage configured to generate a further third amplified signal based on the one or more further third intermediate signals. The circuit arrangement 200 may also include a further second scaler configured to generate a further second output signal based on the further third amplified signal. The further third amplifier stage may be a further third instrumentation amplifier stage. The further second scaler may be a further second adjustable scaler.

The circuit arrangement 200 may further include a further fourth adjustable resistor bridge configured to receive the constant direct current (DC) signal, and further configured to generate one or more further fourth intermediate signals based on the constant direct current (DC) signal. The circuit arrangement 200 may also include a further fourth amplifier stage configured to generate a further fourth amplified signal based on the one or more further fourth intermediate signals. The further fourth amplifier stage may be a further fourth instrumentation amplifier stage.

The circuit arrangement 200 may further include a further fifth adjustable resistor bridge configured to receive the further fourth amplified signal, and further configured to generate one or more further fifth intermediate signals based on the further fourth amplified signal. The circuit arrangement 200 may also include a further fifth amplifier stage configured to generate a further fifth amplified signal based on the one or more further fifth intermediate signals. The circuit arrangement 200 may additionally include a further third scaler configured to generate a further third output signal based on the further fifth amplified signal. The further fifth amplifier stage may be a further fifth instrumentation amplifier stage. The further third scaler may be a further third adjustable scaler.

The circuit arrangement 200 may also include a second summer configured to generate a second summed signal based on the constant direct current (DC) signal, the further second output signal, and the further third output signal. The circuit arrangement 200 may further include a third summer configured to generate a third summed signal based on the first summed signal and the second summed signal.

The adjustable resistor bridge may be adjusted or adjustable by a first resistor stage digital control signal. The further first adjustable resistor bridge and the further second adjustable resistor bridge may be adjusted or adjustable by a second resistor stage digital control signal. The further third adjustable resistor bridge may be adjusted or adjustable by a third resistor stage control signal. The further fourth adjustable resistor bridge and the further fifth adjustable resistor bridge may be adjusted or adjustable by a fourth resistor stage digital control signal. The adjustable scaler may be adjusted or adjustable by a first scaler digital control signal. The further first adjustable scaler may be adjusted or adjustable by a second scaler digital control signal. The further second adjustable scaler may be adjusted or adjustable by a third scaler digital control signal. The further third adjustable scaler may be adjusted or adjustable by a fourth scaler digital control signal.

FIG. 3A is a general illustration 300a of a method of forming a circuit arrangement according to various embodiments. The method may include, in 302, providing an adjustable resistor bridge configured to receive a driving signal from an electronic device, and further configured to generate one or more intermediate signals based on the driving signal. The method may also include, in 304, coupling an amplifier stage, such that the amplifier stage is configured to generate an amplified signal based on the one or more intermediate signals. The amplifier stage may be coupled to the adjustable resistor bridge. The method may additionally include, in 306, coupling a scaler such that the scaler is configured to generate an output signal based on the amplified signal. The scaler may be coupled to the amplifier stage. The adjustable resistor bridge may include at least one resistor of a first resistor type having a first coefficient of resistance with respect to an environmental condition. The adjustable resistor bridge may include at least one resistor of a second resistor type having a second coefficient of resistance with respect to the environmental condition different from the first coefficient. A resistance of the at least one resistor of the first resistor type may be adjustable by a resistor stage digital control signal.

Various embodiments may relate to a method and/or a circuit arrangement for adjusting characteristic, e.g. a temperature characteristic of an analogue signal. The analogue signal, which may also be referred to as a driving signal or a bridge driving signal, may be used to drive a balanced resistor bridge. The resistor bridge may include two types of resistors with different coefficients of resistance with respect to an environmental condition or parameter. For instance, the two types of resistors may have different values of temperature coefficients of resistance (TCR).

In various embodiments, the amplifier stage may be an instrumentation amplifier stage. The scaler may be an adjustable scaler.

Figure 3B:
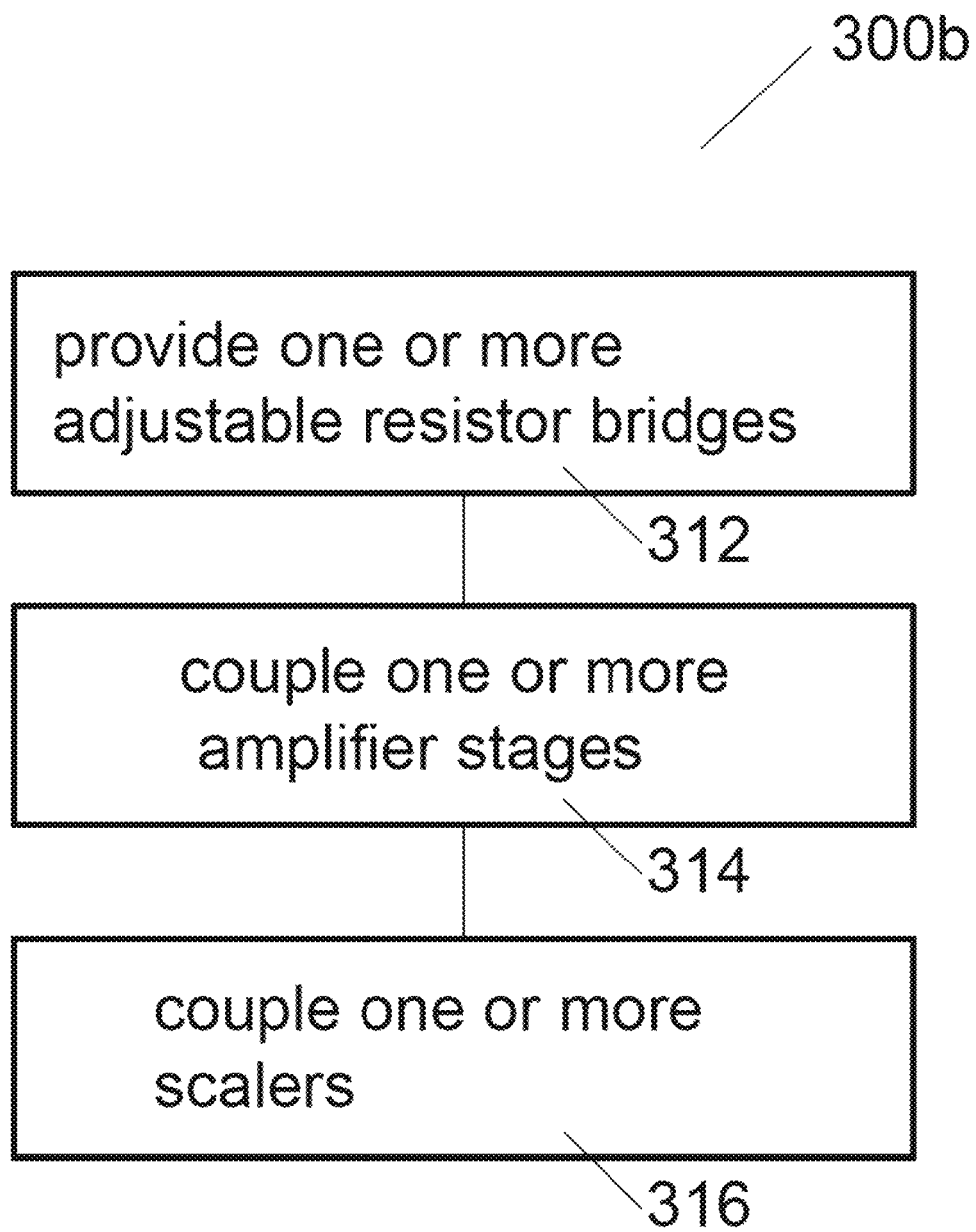
FIG. 3B is a general illustration of a method of forming a circuit arrangement according to various other embodiments.

FIG. 3B is a general illustration 300b of a method of forming a circuit arrangement according to various other embodiments. The method may include, in 312, providing one or more adjustable resistor bridges. The method may also include, in 314, coupling one or more amplifier stages. The method may further include, in 316, coupling one or more scalers, e.g. adjustable scalers.

Figure 4A:
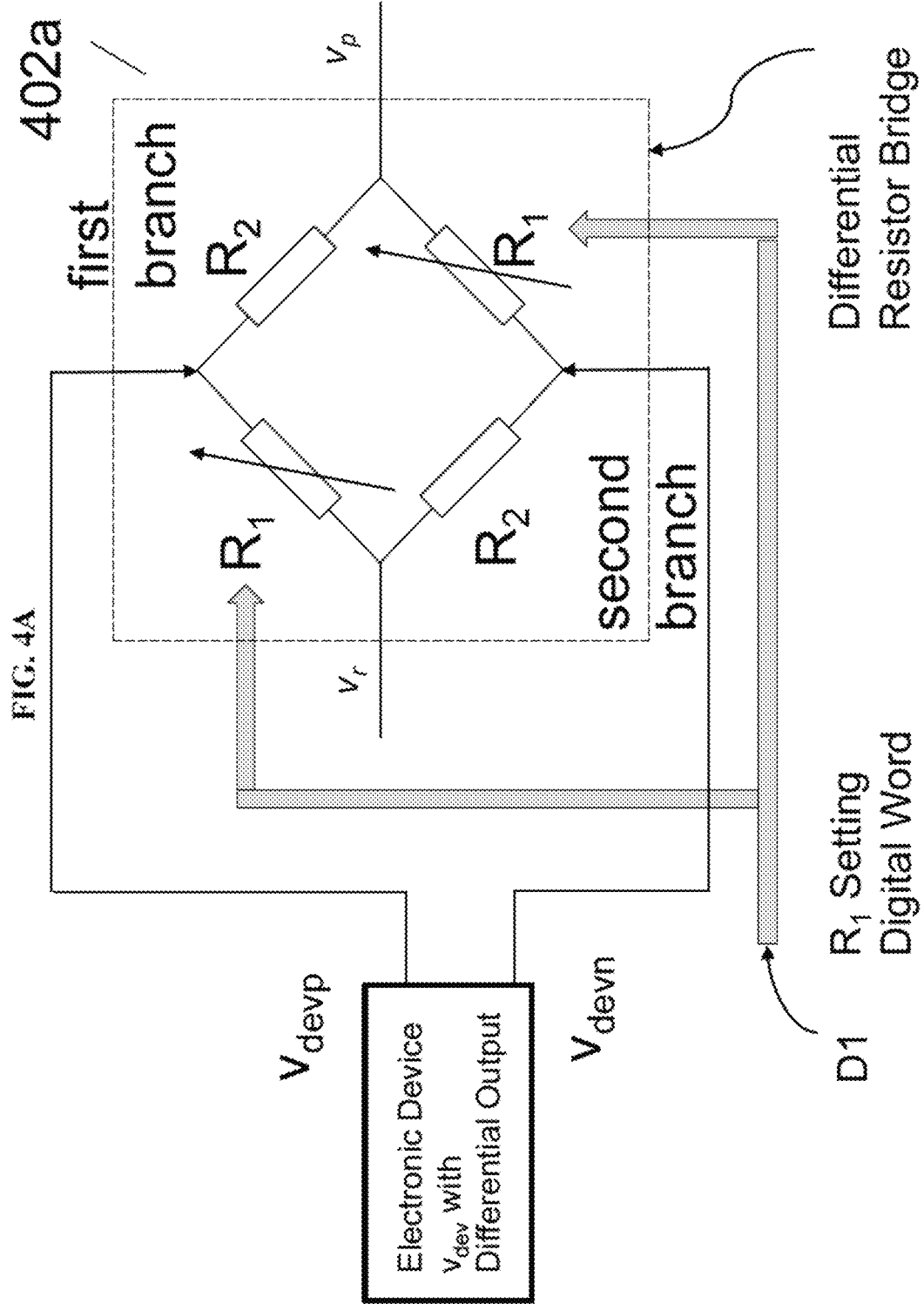
FIG. 4A is a schematic of an adjustable resistor bridge according to various embodiments.

FIG. 4A is a schematic of an adjustable resistor bridge 402a according to various embodiments. The resistor bridge 402a may be referred to as a differential resistor bridge. The resistor bridge 402a may include matching adjustable resistor pair $R_1$ and matching resistor pair $R_2$. $R_1$ and $R_2$ may have different values of temperature coefficients of resistance (TCR). As shown in FIG. 4A, the bridge 402a may include a first branch including one $R_2$ and one $R_1$ connected in series, and a second branch including one $R_1$ and one $R_2$ connected in series. The two $R_1$ may be arranged diagonally with respect to each other, and the two $R_2$ may be arranged diagonally with respect to each other. The differential driving signals $v_{devp}$ and $v_{devn}$ from an electronic device may be provided to the two points connecting the first branch and the second branch. The adjustable pair $R_1$ may be adjusted by a common digital word signal (D1), alternatively referred to as a resistor stage digital control signal. A first intermediate signal $v_p$ may be generated at a point along the line connecting $R_2$ and $R_1$ in the first branch, and a second intermediate signal $v_r$ may be generated at a point along the line connecting $R_1$ and $R_2$ in the second branch.

Figure 4B:
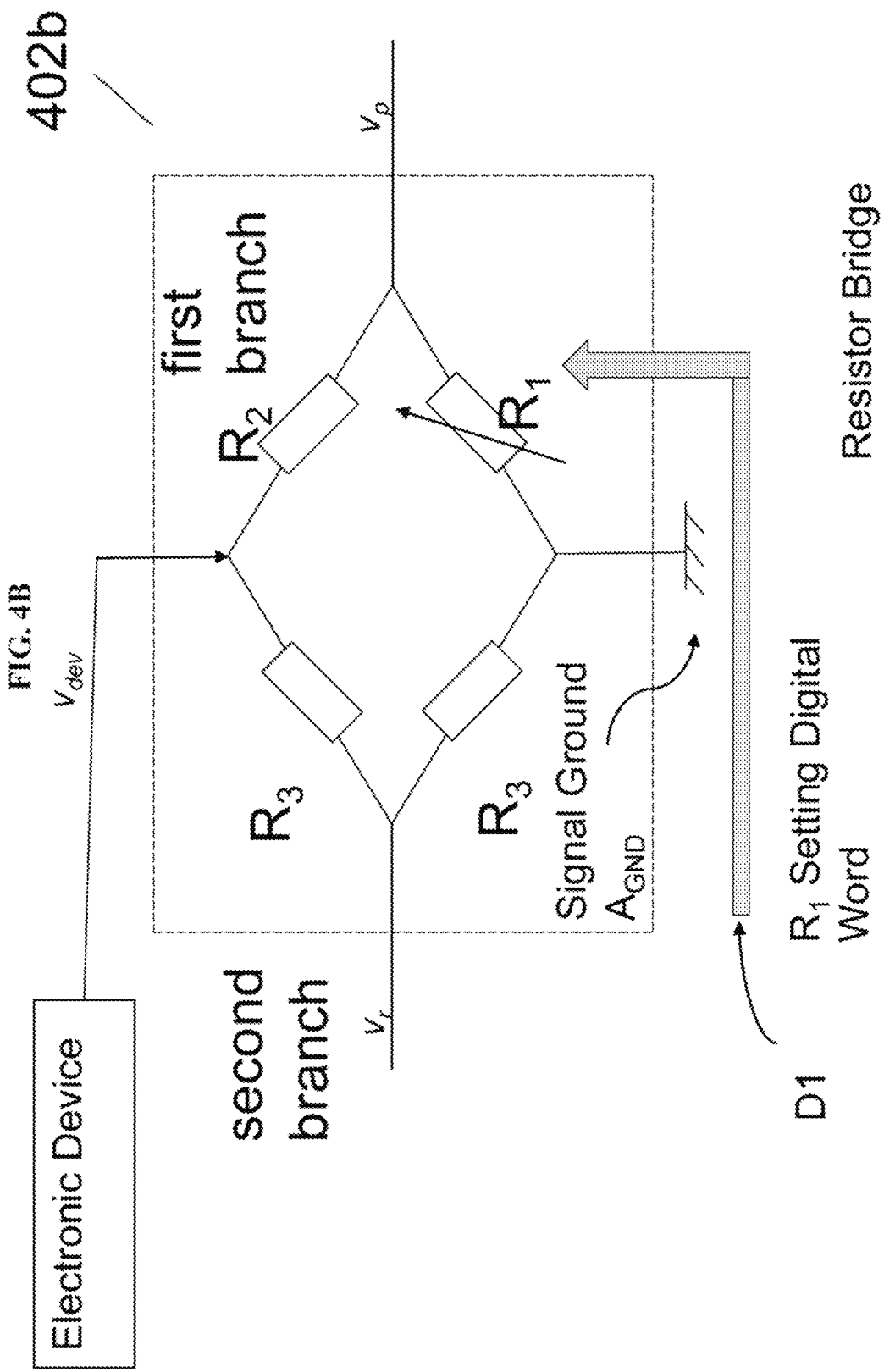
FIG. 4B is a schematic of an adjustable resistor bridge according to various other embodiments.

FIG. 4B is a schematic of an adjustable resistor bridge 402b according to various other embodiments. The resistor bridge 402b may be referred to as a single-ended resistor bridge. The bridge 402b may include a first branch including an adjustable $R_1$ and $R_2$ connected in series. The bridge 402b may include a second branch including two $R_3$ connected in series. $R_1$, $R_2$ and $R_3$ may have different values of TCR. The driving signal $v_{dev}$ from an electronic device may be provided to a point along a line connecting the first branch and the second branch. A point along another line connecting the first branch and the second branch may be connected to signal ground $A_{GND}$. The adjustable $R_1$ may be adjusted by a digital word signal (D1). A first intermediate signal $v_p$ may be generated at a point along the line connecting $R_2$ and $R_1$ in the first branch, and a second intermediate signal $v_r$ may be generated at a point along the line connecting the two $R_3$ in the second branch. The second intermediate signal $v_n$ may be provided by $$v_r = \frac{v_{dev}}{2} \quad (2)$$

Accordingly, the second intermediate signal $v_r$ may be independent of temperature, since the two $R_3$ in the second branch have the same TCR. The first intermediate signal $v_p$ may have an approximate first-order temperature dependence in the form $$v_p \approx \frac{v_{dev}}{2}\left(1 + \frac{(TCR1_{R1} - TCR1_{R2})(T - T_{ref})}{2} + \right.$$
$$\left. \frac{(TCR2_{R1} - TCR2_{R2})(T - T_{ref})^2}{2} \right) \approx \frac{v_{dev}}{2}(1 + TCR1_{equiv}(T - T_{ref}) + TCR2_{equiv}(T - T_{ref})^2) \quad (3)$$

$R_1$ and $R_2$ may be defined as:

$$R_1 = R_1(T_{ref})(1 + TCR1_{R1}(T - T_{ref}) + TCR2_{R1}(T - T_{ref})^2)$$
$$R_2 = R_2(T_{ref})(1 + TCR1_{R2}(T - T_{ref}) + TCR2_{R2}(T - T_{ref})^2)$$

where $TCR1_{Ry}$ is the first order temperature coefficient of resistance of resistor $R_y$, and $TCR2_{Ry}$ is the second order temperature coefficient of resistance of resistor $R_y$.

Assuming $TCR1_{R2} \ll TCR1_{R1} \ll 1$, $TCR2_{R1}$,
$TCR2_{R2} \ll TCR1_{R2}$ and $R_1(T_{ref}) = R_2(T_{ref})$ $$v_p = v_{dev}\left(\frac{R_1(1 + TCR1_{R1}(T - T_{ref}) + TCR2_{R1}(T - T_{ref})^2)}{\left(\begin{array}{c} R_1(1 + TCR1_{R1}(T - T_{ref}) + TCR2_{R1}(T - T_{ref})^2) + \\ R_2(1 + TCR1_{R2}(T - T_{ref}) + TCR2_{R2}(T - T_{ref})^2) \end{array}\right)}\right) \approx$$

$$v_{dev}\frac{R_1}{R_1 + R_2}\left(1 + \frac{R_2}{R_1 + R_2}(TCR1_{R1} - TCR1_{R2})(T - T_{ref}) + \right.$$
$$\left. \frac{R_2}{R_1 + R_2}(TCR2_{R1} - TCR2_{R2})(T - T_{ref})^2\right) \approx$$

$$\frac{v_{dev}}{2}\left(1 + \frac{(TCR1_{R1} - TCR1_{R2})(T - T_{ref})}{2} + \frac{(TCR2_{R1} - TCR2_{R2})(T - T_{ref})^2}{2}\right) \approx$$

$$\frac{v_{dev}}{2}(1 + TCR1_{equiv}(T - T_{ref}) + TCR2_{equiv}(T - T_{ref})^2)$$

Equation (3) may be due to resistors $R_1$ and $R_2$ in the first branch having differing first-order and second-order TCR values. $TCR1_{R1}$ is the first-order temperature coefficient of resistance for $R_1$, $TCR1_{R2}$ is the first-order temperature coefficient of resistance for $R_2$, $TCR2_{R1}$ is the second-order temperature coefficient of resistance for $R_1$, and $TCR2_{R2}$ is the second-order temperature coefficient of resistance for $R_2$. When the temperature is $T_{ref}$ (i.e. the zero-reference temperature point), $$R_1(T_{ref}) = R_2(T_{ref}) \quad (4)$$

The resistor bridge 402b may be balanced. By first approximation, $$v_p \approx \frac{v_{dev}}{2}\left(1 + \frac{(TCR1_{R1} - TCR1_{R2})(T - T_{ref})}{2}\right) \approx \quad (5)$$

$$\frac{v_{dev}}{2}(1 + TCR1_{equiv}(T - T_{ref}))$$

Figure 4C:
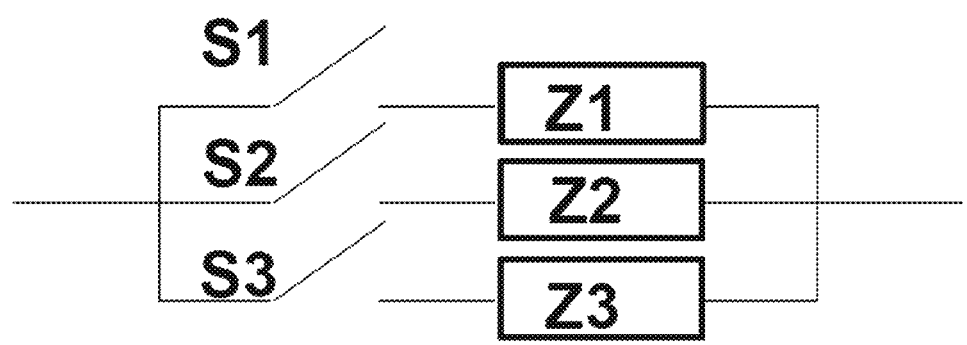
FIG. 4C is a schematic showing an adjustable resistor according to various embodiments.

FIG. 4C is a schematic showing an adjustable resistor according to various embodiments. The adjustable resistor may be $R_1$ shown in FIGS. 4A-B. As shown in FIG. 4C, the adjustable resistor may have a plurality of switches S1-S3, and a plurality of resistors Z1-Z3. Each switch may be connected with a corresponding resistor in one branch. While FIG. 4C shows 3 branches with 3 switches and 3 resistors, the adjustable resistor may have any number (>2) of branches with switches and resistors. When the digital word signal or resistor stage digital control signal is applied to the adjustable resistor, the switches may be opened or closed based on the digital control signal. For instance, when a first digital control signal is applied, the first digital control signal may trigger S1 to be in the closed position, while S2 and S3 are in the open position. When a second digital control signal is applied the second digital control signal may trigger switches S2 to be in the closed position while S1 and S3 are in the open position. Accordingly, the resistance of the variable resistor may be varied dependent on the resistor stage digital control signal.

Figure 4D:
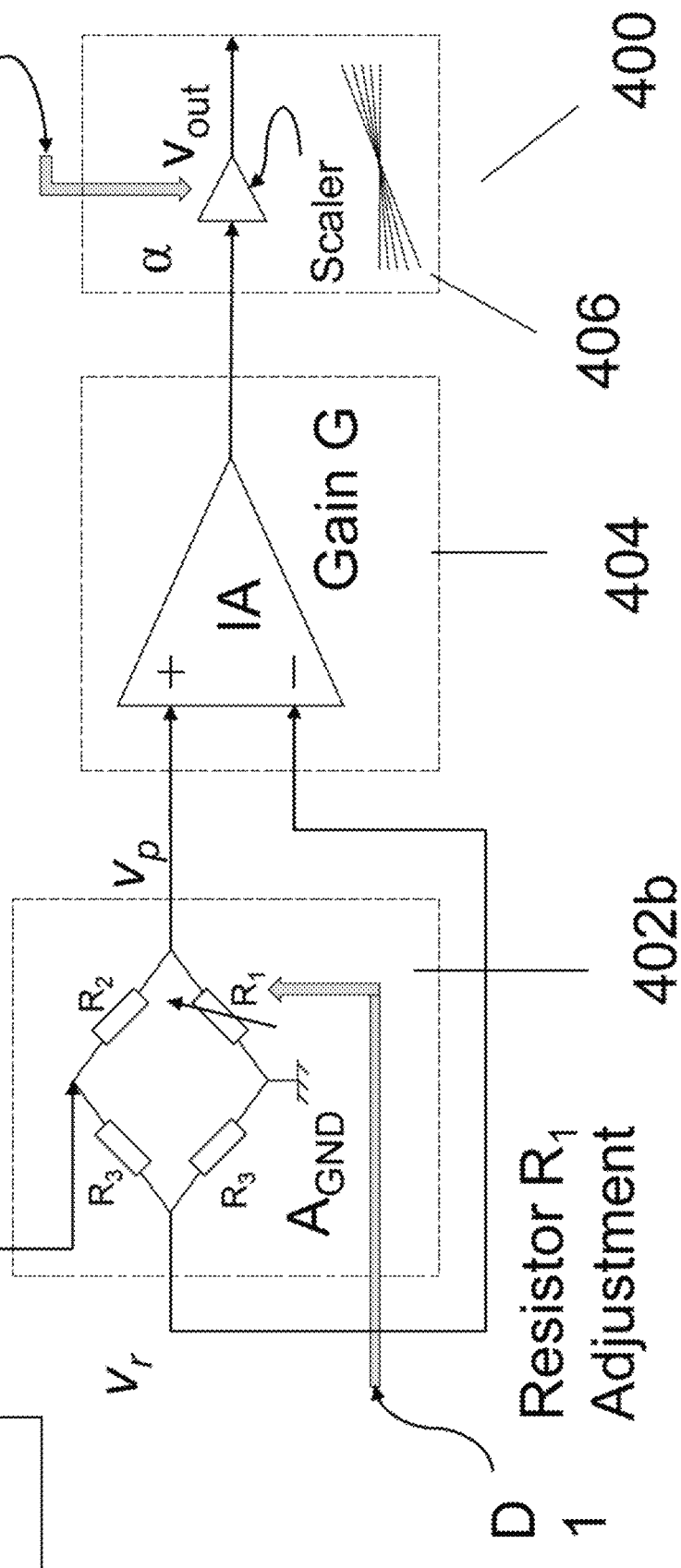
FIG. 4D is a schematic of a circuit arrangement according to various embodiments.

FIG. 4D is a schematic of a circuit arrangement 400 according to various embodiments. The circuit arrangement 400 may include an adjustable resistor bridge 402b, an instrumentation amplifier (IA) stage 404 (with gain G), and an adjustable scaler 406. While FIG. 4D shows adjustable resistor bridge 402b shown in FIG. 4B, various other embodiments may include adjustable resistor bridge 402a shown in FIG. 4A or any other suitable adjustable resistor bridge instead of adjustable resistor bridge 402b. The instrumentation amplifier (IA) stage 404 may include an instrumentation amplifier. The instrumentation amplifier may be configured to generate the amplified signal based on intermediate signals $v_r$, $v_p$. The amplified signal may be provided to the adjustable scaler 406.

Figure 5A:
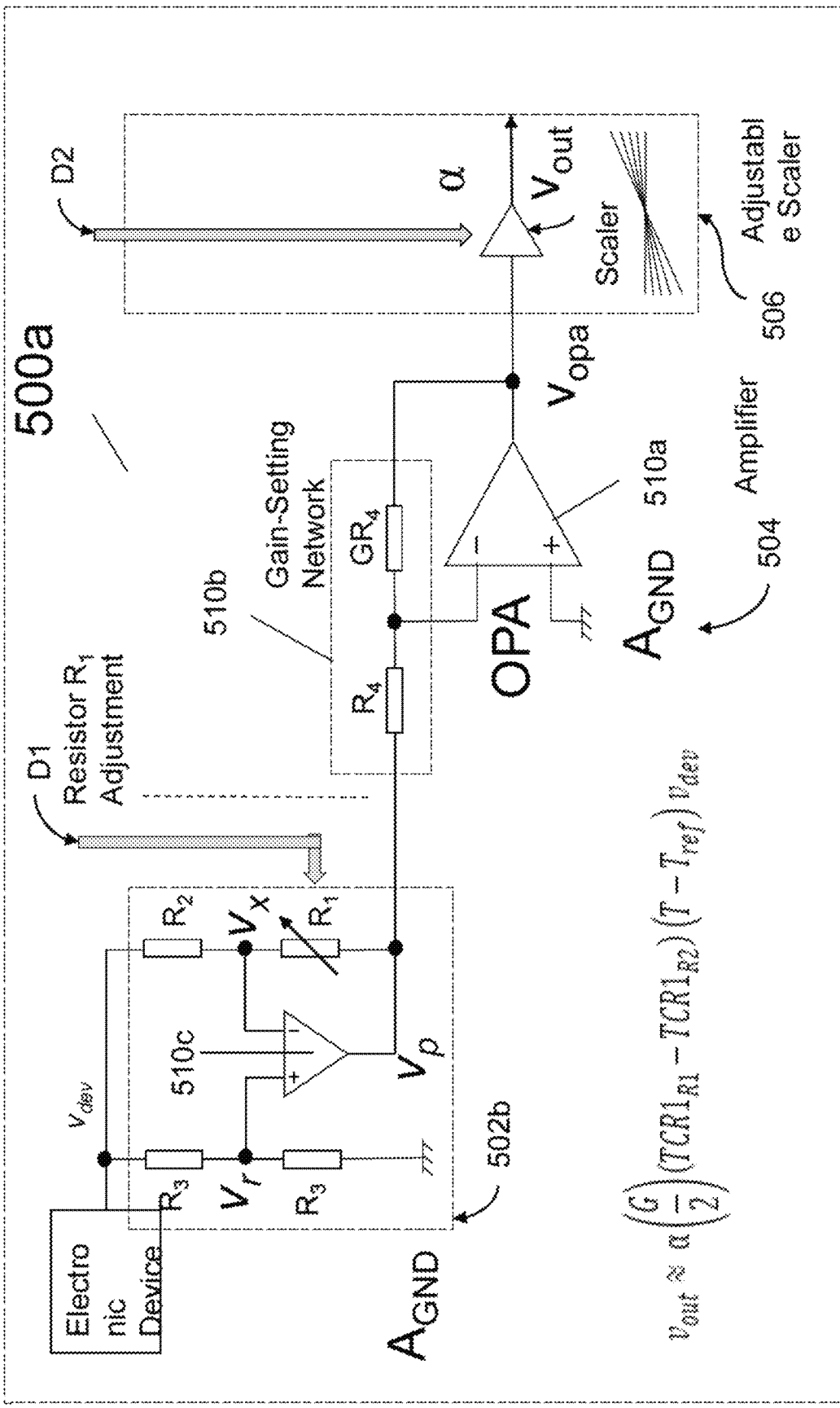
FIG. 5A is a schematic of a circuit arrangement according to various embodiments.

FIG. 5A is a schematic of a circuit arrangement 500a according to various embodiments. The circuit arrangement 500a may include an adjustable resistor bridge 502b, an amplifier stage 504, and a scaler 506. The adjustable resistor bridge 502b may include a first branch including one $R_1$ and one $R_2$, as well as a second branch including two $R_3$, similar to that shown in FIG. 4B. A connection point between the $R_1$ and the $R_2$ may be at $v_x$, and a further connection point between the two $R_3$ may be at $v_r$. The first branch and the second branch may be joined at a connection point biased at $v_{dev}$. However, various other embodiments may include any other suitable adjustable bridge.

The amplifier stage 504 may include an operational amplifier (op-amp) 510a, a resistive feedback network 510b that is used to set the gain of the amplifier 510a, and an input operational amplifier 510c. The resistive feedback network 510b may have a resistor with resistance $R_4$ and a further resistor with resistance $GR_4$. The inverting input of the operational amplifier 510a may be connected to one end of $R_4$ and one end of $GR_4$. Another end of $GR_4$ may be connected to the output of the operational amplifier 510a. Another end of $R_4$ may be connected to the output of the input operational amplifier 510c. The inverting input of the input operational amplifier 510c may be connected to a connection point between $R_1$ and $R_2$ (at $v_x$), while the non-inverting input of the input operational amplifier 510c may be connected to a further connection point between the two $R_3$ (at $v_r$). The first branch may have an end at $v_{dev}$ and may have an opposing end connected to the output of the amplifier 510c. The second branch may have an end at $v_{dev}$ and may have an opposing end at signal ground $A_{GND}$. The amplifier 510c may drive the connection point at voltage $v_p$ so that $v_x$ at the inverting input may be forced to follow $v_r$. As a result, $v_p$ may be the temperature dependent component of the signal $v_{dev}$ driving the bridge 502b, arising from the change in resistance values due to the temperature coefficients of resistances of resistors $R_1$ and $R_2$. The non-inverting input of the operational amplifier 510a may be connected to signal ground $A_{GND}$.

The amplifier stage 504 may be configured to increase the magnitude of the temperature dependent component of the driving signal generated by the resistor bridge 502b. The resistive feedback network 510b may set the gain of the amplifier stage 504.

The adjustable scaler 506 may have a scaling factor $\alpha$. The scaler 506 may be configured to generate an output signal $v_{out}$ based on the amplified signal. The input operational amplifier 510c may be configured to generate a temperature dependent signal $v_p$ based on the intermediate signals $v_r$, $v_x$. The operational amplifier 510a and the resistive feedback network 510b may be configured to generate the amplified signal $v_{opa}$ based on the temperature dependent signal $v_p$.

The circuit arrangement 500a may be a temperature adjustment circuit that enables adjustment of the first-order temperature coefficient of sensitivity TCS1 (of the circuit arrangement 500a) for bridge driving signal $v_{dev}$. Two independent types of adjustment may be possible:
(1) Adjustment of the value of $T_{ref}$, the zero-reference temperature point at which the resistor bridge is balanced. This may be achieved by using digital word signal D1 (alternatively referred to as a resistor stage digital control signal) to adjust $R_1$ in the adjustable resistor bridge 502b.
(2) Adjustment of the value of the magnitude of TCS1 by using digital word signal D2 (alternatively referred to as a scalar digital control signal) to control setting of the adjustable digital scaler 506.

The equivalent TCR1, $TCR1_{equiv}$ generated by the resistor bridge 502b for bridge driving signal $v_{dev}$ may be provided by $$TCR1_{equiv} = \frac{TCR1_{R1} - TCR1_{R2}}{2} \quad (6)$$

In order to increase the range of $TCR1_{equiv}$, the output of the bridge 502b may be connected to the amplifier stage 504 as shown in FIG. 5A.

From Equation (3), $$v_p \approx A_{GND} - \frac{v_{dev}}{2}((TCR1_{R1} - TCR1_{R2})(T - T_{ref}) + \quad (7)$$
$$(TCR2_{R1} - TCR2_{R2})(T - T_{ref})^2) \approx$$
$$A_{GND} - \frac{v_{dev}}{2}(TCR1_{R1} - TCR1_{R2})(T - T_{ref})$$

$$v_{opa} = G\frac{v_{dev}}{2}((TCR1_{R1} - TCR1_{R2})(T - T_{ref}) + \quad (8)$$
$$(TCR2_{R1} - TCR2_{R2})(T - T_{ref})^2) \approx$$
$$G\frac{v_{dev}}{2}(TCR1_{R1} - TCR1_{R2})(T - T_{ref})$$

-continued $$v_{out} = \alpha v_{opa} = \alpha G \frac{v_{dev}}{2} \quad (9)$$
$$((TCR1_{R1} - TCR1_{R2})(T - T_{ref}) + (TCR2_{R1} - TCR2_{R2})(T - T_{ref})^2) = \alpha G(TCR1_{equiv}(T - T_{ref}) + TCR2_{equiv}(T - T_{ref})^2)v_{dev} =$$
$$(TCS1(T - T_{ref}) + TCS2(T - T_{ref})^2)v_{dev} \approx TCS1(T - T_{ref})v_{dev}$$

TCS1 relates to the circuit arrangement 500a including the adjustable resistor stage 502b, the amplifier stage 510, and the adjustable scaler 506. The resistive feedback network 510b may be used to set gain of the amplifier 510a by a factor of G. From equation (9), the output of the amplifier stage 504 may be approximated to a first order as $$G\left(\frac{TCR1_{R1} - TCR1_{R2}}{2}\right)(T - T_{ref})v_{dev}.$$

The output of the amplifier stage 504 may be scaled by the adjustable scaler 506 to generate an output signal which may be approximated as $$v_{out} \approx \alpha G\left(\frac{TCR1_{R1} - TCR1_{R2}}{2}\right)(T - T_{ref})v_{dev} \approx \quad (10)$$
$$\alpha G TCR1_{equiv}(T - T_{ref})v_{dev}$$

Figure 5B:
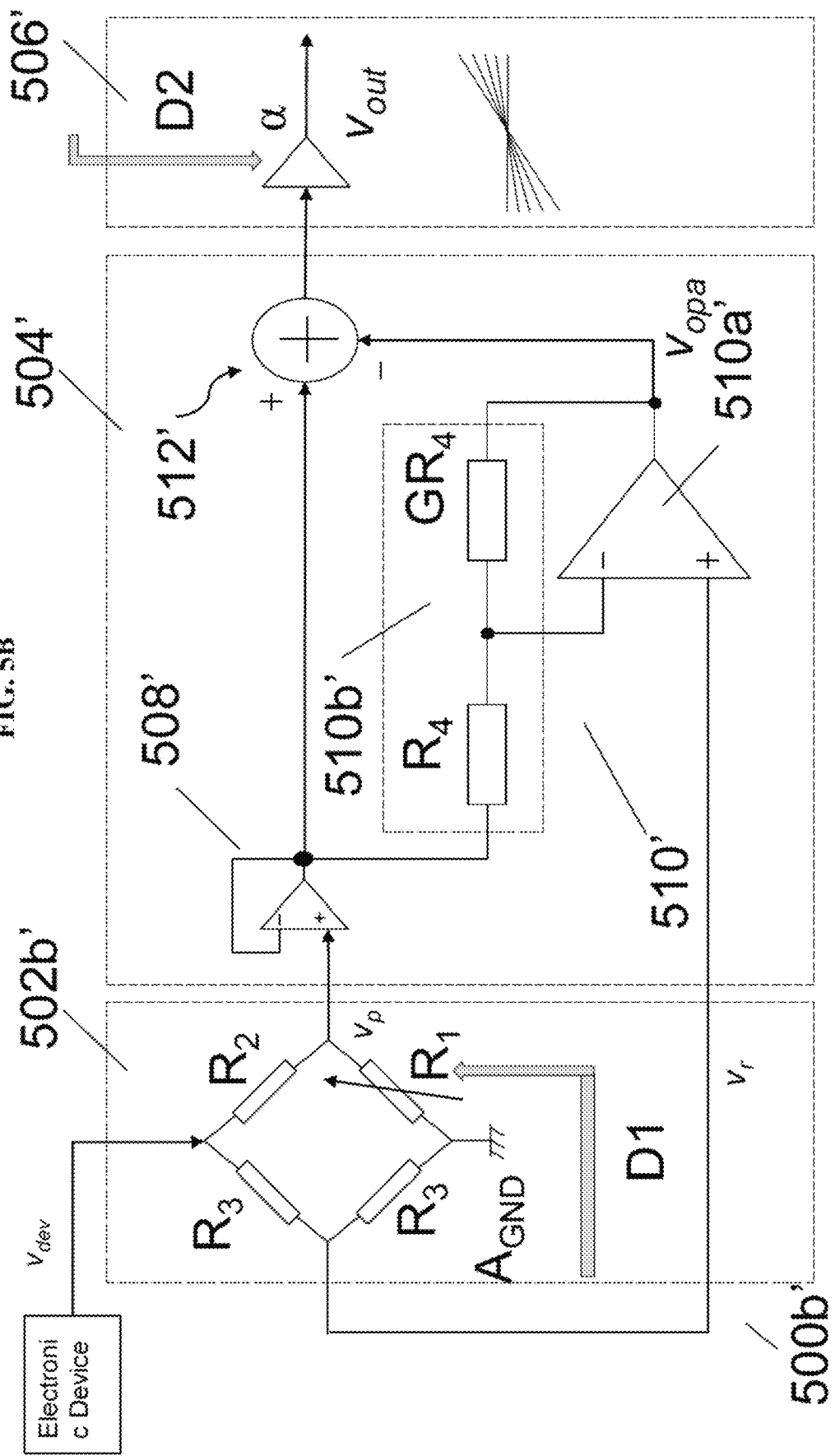
FIG. 5B is a schematic of a circuit arrangement according to various other embodiments.

FIG. 5B is a schematic of a circuit arrangement 500b according to various other embodiments. The circuit arrangement 500b may include a resistor bridge 502b', an amplifier stage 504', and a scaler 506'. While FIG. 5B shows that the resistor bridge 502b' may be the resistor bridge 402b shown in FIG. 4B, various other embodiments may include resistor bridge 402a shown in FIG. 4A or any other suitable resistor bridge instead of resistor bridge 402b.

The amplifier stage 504' may be or may include a gain-summer amplifier as shown in FIG. 5B. However, various other embodiments may include any other suitable amplifier. The amplifier stage 504' or gain-summer amplifier may include a voltage follower 508' having an input (e.g. positive input) configured to receive a first intermediate signal $v_p$ of the one or more intermediate signals from the resistor bridge 502b', and an output configured to generated an unity signal based on the first intermediate signal. A further input of the voltage follower 508' may be connected to the output of the voltage follower 508'.

The amplifier stage 504' or gain-summer amplifier may also include a differential amplifier 510' having a first input connected to the output of the voltage follower 508' and configured to receive the unity signal, a second input connected to the resistor bridge 502b' and configured to receive a second intermediate signal $v_r$ of the one or more intermediate signals from the resistor bridge 502b', and an output configured to generate a gain signal based on the unity signal and the second intermediate signal.

The differential amplifier 510' may include an operational amplifier (op-amp) 510a' and a resistive feedback network 510b' that is used to set the gain of the amplifier 510a'. The resistive feedback network 510b; may have a resistor with resistance $R_4$ and a further resistor with resistance $GR_4$. The inverting input of the operational amplifier 510a' may be connected to one end of $R_4$ and one end of $GR_4$. Another end of $GR_4$ may be connected to the output of the operational amplifier 510a'. Another end of $R_4$ may be connected to the voltage follower 508'. The non-inverting input of the operational amplifier 510a' may be connected to the resistor bridge 502b'.

The amplifier stage 504' or gain-summer amplifier may further include a summer 512' having a first input (e.g. positive input) connected to the output of the voltage follower and configured to receive the unity signal, a second input (e.g. negative input) connected to the output of the differential amplifier and configured to receive the gain signal, and an output configured to generate the amplified signal based on the unity signal and the gain signal.

The amplifier stage 504' may be configured to increase the magnitude of the temperature dependent component of the driving signal generated by the resistor bridge 502b'. The resistive feedback network 510b' may set the gain of the amplifier stage 504'.

The scaler 506' may have a scaling factor α. The scaler 506' may be configured to generate an output signal $v_{out}$ based on the amplified signal.

Figure 6A:
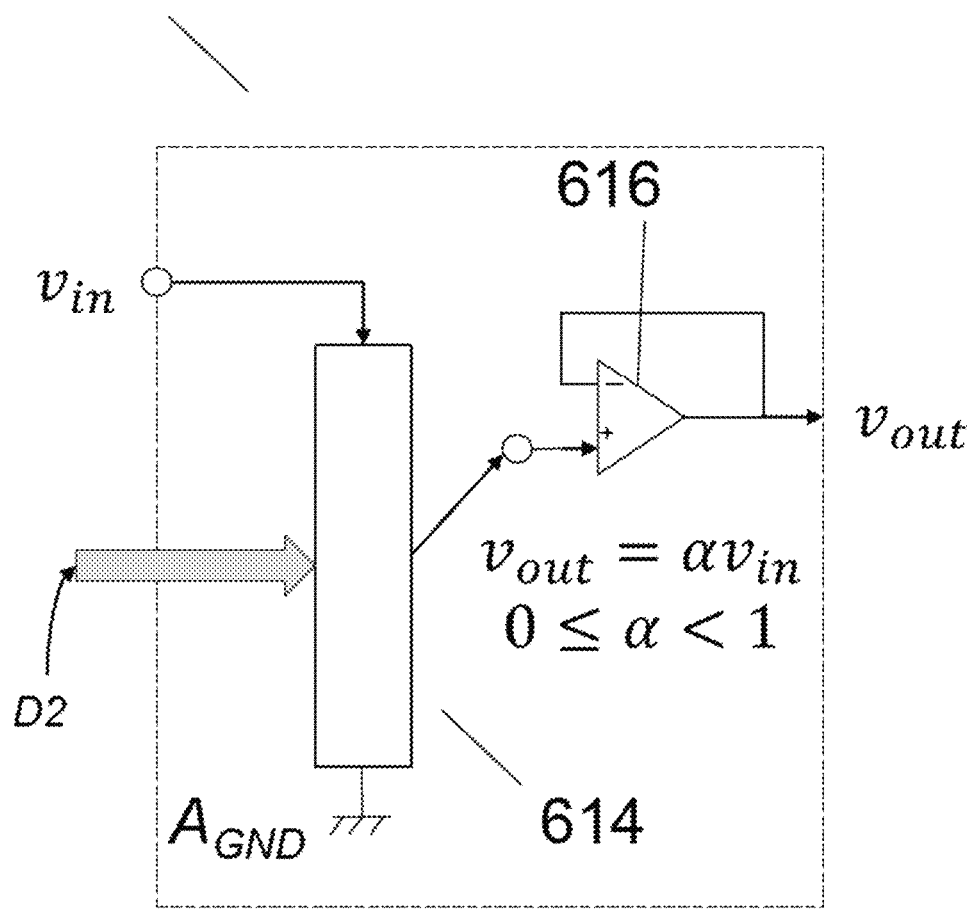
FIG. 6A shows a schematic of an adjustable scaler according to various embodiments.

FIG. 6A shows a schematic of an adjustable scaler 606a according to various embodiments. The scaler 606a may include a digital potentiometer 614 and voltage follower 616 connected to the digital potentiometer 614. A digital word signal D2 may be used to set the scale factor α within a range of 0≤α<1 by controlling the tap position of the digital potentiometer 614. Various other embodiments may include any other suitable type of scaler. $V_{in}$ provided to the potentiometer 614 may be the amplified signal from the amplifier stage.

Accordingly, $v_{out}$ may be adjusted between $0 \leq v_{out} \leq G \ TCR1_{equiv}(T-T_{ref})v_{dev}$ as a is swept from 0≤α<1.

FIG. 6B is a schematic showing another adjustable scaler 606b according to various embodiments.

The scaler 606b may include an operational amplifier 616', an adjustable resistor 614' with one end connected to the inverting input of the operational amplifier 616' and another end connected to the output of the operational amplifier 616', as well as a resistor 618' with an end connected to the inverting input of the operational amplifier 616'. $v_{in}$ may be the amplified signal from the amplifier stage provided to the scaler 606, and provided to resistor 618'. Signal ground $A_{GND}$ may be provided to the non-inverting input of the amplifier 616'.

Multiple adjustable resistor bridges may be cascaded in series to generate higher orders of temperature coefficient of sensitivity for the bridge driving signal $v_{dev}$.

Figure 7:
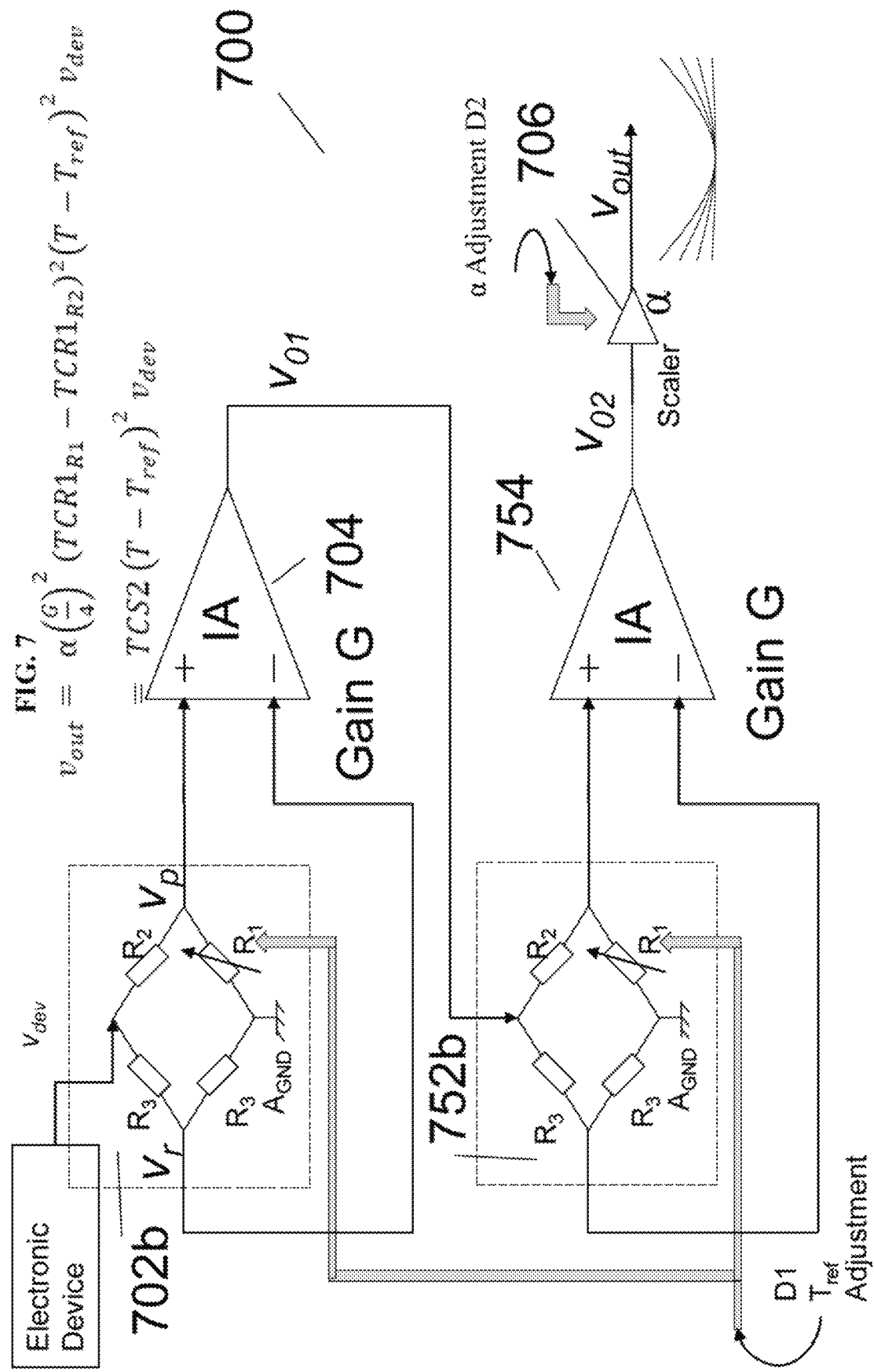
FIG. 7 shows a circuit arrangement according to various embodiments for adjusting a second-order temperature coefficient of sensitivity for a driving signal $v_{dev}$.

FIG. 7 shows a circuit arrangement 700 according to various embodiments for adjusting a second-order temperature coefficient of sensitivity for a driving signal $v_{dev}$.

The circuit arrangement 700 may include an adjustable resistor bridge 702b, and an instrumentation amplifier stage 704. The resistor bridge 702b may be configured to receive a driving signal $v_{dev}$ from an electronic device, and further configured to generate one or more intermediate signals $v_p$, $v_r$ based on the driving signal. The instrumentation amplifier stage 704 may be configured to generate an amplified signal $v_{01}$ based on the one or more intermediate signals.

The circuit arrangement 700 may further include a further adjustable resistor bridge 752b configured to receive the amplified signal, and further configured to generate one or more further intermediate signals based on the amplified signal $v_{01}$. The circuit arrangement 700 may also include a further instrumentation amplifier stage 754 configured to generate a further amplified signal $v_{02}$ based on the one or more further intermediate signals. The circuit arrangement 700 may include an adjustable scaler 706 configured to generate the output signal $v_{out}$ based on the further amplified signal $v_{o2}$ (i.e. indirectly on the amplified signal $v_{o1}$).

The output signal of circuit arrangement 700 may be provided by $$v_{out} \approx \left( \alpha \left(\frac{G}{4}\right)^2 (TCR1_{R1} - TCR1_{R2})^2 (T - T_{ref})^2 \right) v_{dev} \quad (11)$$

The adjustable resistor bridge 702b and the further adjustable resistor bridge 752b may be matching or similar/identical, and may be cascaded in series. The two adjustable $R_1$ included in the bridges 702b, 752b may be similar or identical, and may be controlled by a common digital word line (carrying the resistor stage digital control signal). Another digital word line (carrying the scalar digital control signal) may set the scale factor α in the adjustable scaler 706 by controlling the tap position of the potentiometer.

The adjustable resistor bridge 702b may generate a temperature dependent component of the bridge driving signal $v_{dev}$ of the form $$\frac{v_{dev}}{2} \left( 1 + \frac{(TCR1_{R1} - TCR1_{R2})(T - T_{ref})}{2} + \frac{(TCR2_{R1} - TCR2_{R2})(T - T_{ref})^2}{2} \right).$$

As highlighted above, $TCR1_{R1}$ is the first-order temperature coefficient of resistance for $R_1$, $TCR1_{R2}$ is the first-order temperature coefficient of resistance for $R_2$, $TCR2_{R1}$ is the second-order temperature coefficient of resistance for $R_1$, and $TCR2_{R2}$ is the second-order temperature coefficient of resistance for $R_2$. The signal generated has a major first-order component and minor higher-order components of temperature dependence. Multiple matching resistor bridges, such that that shown by FIG. 7, may be used to generate higher order components of the bridge driving signal $v_{dev}$ that may be used to correct for these higher-order nonlinearities in temperature dependence. In various embodiments, a higher order of dependence on the environmental condition, e.g. temperature may be realized by series connection of more than one matching resistor bridge. In various embodiments, a quadratic adjustment of the form $(1+TCS1(T-T_{ref})+TCS2(T-T_{ref})^2)$ may be realized for any analogue electronic device. As shown above, the adjustment may be dependent on coefficients TCS1, TCS2 and $T_{ref}$.

While FIG. 7 shows adjustable resistor bridges 702b, 752b similar to bridge 402b as depicted in FIG. 4B, various embodiments may include any suitable type of adjustable resistor bridge, including the resistor bridge shown in FIG. 4A. Similarly, while FIG. 7 shows instrumentation amplifier stages 704, 754 similar to the instrumentation amplifier stage 404 shown in FIG. 4D, various embodiments may include any suitable type of amplifier stage such as the amplifier stage 504 shown in FIG. 5A or the amplifier stage 504'; shown in FIG. 5B. In addition, the adjustable scaler 706 may be any suitable type of adjustable scaler, such as the scaler 606a shown in FIG. 6A or the scaler 606b shown in FIG. 6B.

Figure 8:
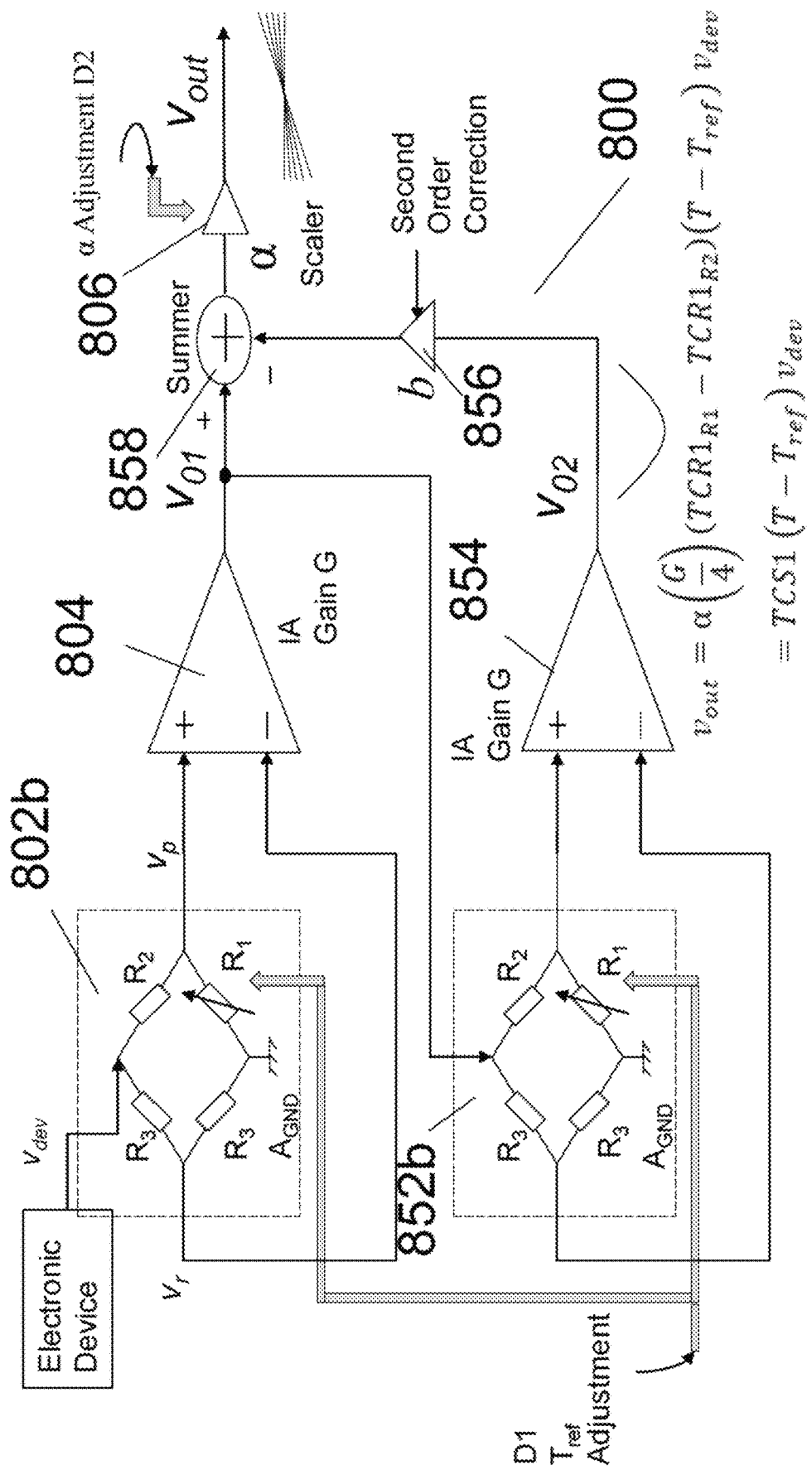
FIG. 8 shows a circuit arrangement according to various embodiments for improving a linearity of a first-order temperature coefficient of sensitivity adjustment for bridge driving signal $v_{dev}$ by compensation of a second-order temperature component of $v_{dev}$.

FIG. 8 shows a circuit arrangement 800 according to various embodiments for improving a linearity of a first-order temperature coefficient of sensitivity adjustment for bridge driving signal $v_{dev}$ by compensation of a second-order temperature component of $v_{dev}$.

The circuit arrangement 800 may include an adjustable resistor bridge 802b, and an instrumentation amplifier stage 804. The adjustable resistor bridge 802b may be configured to receive a driving signal $v_{dev}$ from an electronic device, and further configured to generate one or more intermediate signals $v_p$, $v_r$ based on the driving signal. The instrumentation amplifier stage 804 may be configured to generate an amplified signal $v_{o1}$ based on the one or more intermediate signals.

The circuit arrangement 800 may also include a further adjustable resistor bridge 852b configured to receive the amplified signal $v_{o1}$, and further configured to generate one or more further intermediate signals based on the amplified signal. The circuit arrangement 800 may additionally include a further instrumentation amplifier stage 854 configured to generate a further amplified signal $v_{o2}$ based on the one or more further intermediate signals.

The circuit arrangement 800 may include an adjustable scaler 806 and a further scaler 856. The further scaler 856 may be configured to generate a second order correction signal based on the further amplified signal $v_{o2}$.

The circuit arrangement 800 may additionally include a summer 858 having a first input (e.g. the positive input) configured to receive the amplified signal $v_{o1}$ from the instrumentation amplifier stage 804, a second input (e.g. the negative input) configured to receive the second order correction signal from the further scaler 856, and an output configured to generate a summed signal based on the amplified signal and the second order correction signal.

The adjustable scaler 806 may be configured to generate the output signal $v_{out}$ based on the summed signal. The output may be provided by:

$$v_{out} \approx \left( \alpha \left(\frac{G}{4}\right) (TCR1_{R1} - TCR1_{R2})(T - T_{ref}) \right) v_{dev} \quad (12)$$

While FIG. 8 shows adjustable resistor bridges 802b, 852b similar to bridge 402b as depicted in FIG. 4B, various embodiments may include any suitable type of adjustable resistor bridge, including the resistor bridge shown in FIG. 4A. Similarly, while FIG. 8 shows instrumentation amplifier stages 804, 854 similar to the instrumentation amplifier stage 404 shown in FIG. 4D, various embodiments may include any suitable type of amplifier stage such as the amplifier stage 504 shown in FIG. 5A or the amplifier stage 504' shown in FIG. 5B. In addition, the adjustable scalers 806, 856 may be any suitable type of adjustable scaler, such as the scaler 606a shown in FIG. 6A or the scaler 606b shown in FIG. 6B.

The circuit arrangement 800 may improve the linearity of a first-order temperature coefficient of sensitivity adjustment $$v_{out} = \alpha \left(\frac{G}{4}\right)(TCR1_{R1} - TCR1_{R2})(T - T_{ref})v_{dev}$$

for the driving signal $v_{dev}$. This may be accomplished by setting an appropriate value for scale factor b to substantially compensate for or cancel out the second-order component $$\frac{v_{dev}}{2}\left(\frac{(TCR2_{R1} - TCR2_{R2})(T - T_{ref})^2}{2}\right)$$

of TCS produced by the bridge 802b. A scalar stage control signal on a digital word line may set the scale factor α for the adjustable scalar 806 with a range of 0≤α<1 by controlling the tap position of the potentiometer.

Various embodiments may remove or substantially remove the nonlinearity in approximate first-order dependence of the driving signal on temperature. Various embodiments may provide a first-order component of the driving signal with improved linearity.

Figure 9A:
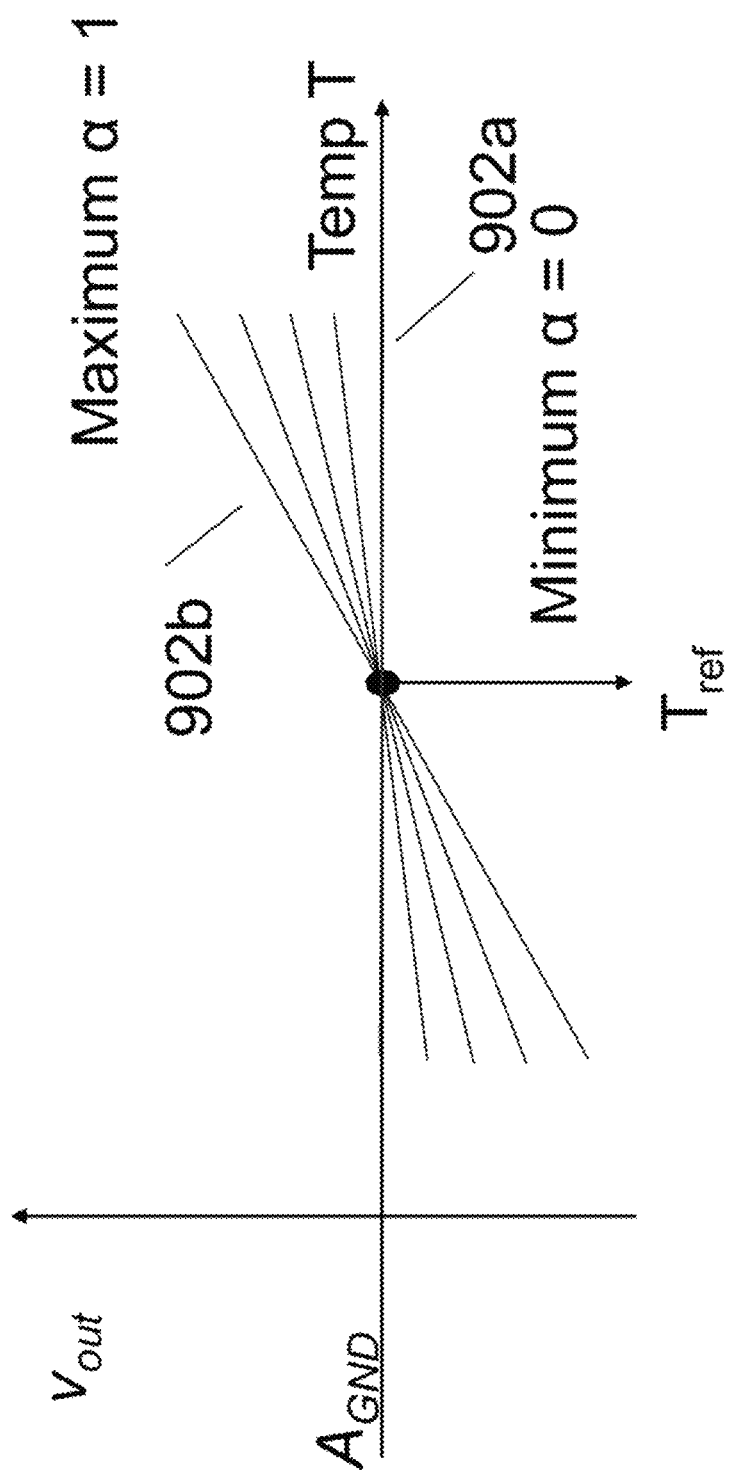
FIG. 9A is a plot of output voltage ($v_{out}$) as a function of temperature (T) illustrating how the relationship between the output voltage and temperature, arising from the first-order temperature coefficient sensitivity of temperature or TCS1, varies with scale factor $\alpha$ in circuit arrangement shown in FIG. 4D.

FIG. 9A is a plot of output voltage ($v_{out}$) as a function of temperature (T) illustrating how the relationship between the output voltage and temperature, i.e. the overall first-order temperature coefficient of sensitivity or TCS1 varies with scale factor α in circuit arrangement 400 shown in FIG. 4D according to various embodiments. As the scale factor α is swept between 0≤α<1, the overall first-order temperature coefficient of sensitivity TCS1 varies between 0≤

$$0 \le TCS1 \le \left(\frac{G}{4}\right)(TCR1_{R1} - TCR1_{R2}),$$

as shown in FIG. 9A. TCS1=0 may be defined by line 902a, while $$TCS1 = \left(\frac{G}{4}\right)(TCR1_{R1} - TCR1_{R2})$$

may be defined by line 902b.

The zero-reference temperature point $T_{ref}$ for the temperature coefficient of sensitivity adjustment may be modified by changing resistor values required for the adjustable resistor bridge 402b to reach a balanced condition. This may be done by setting a resistor bridge control signal, i.e. a digital word, that varies the value of adjustable resistor $R_1(T)$ relative to $R_2(T)$ in a resistor bridge. At $T_{ref}$, $R_1(T_{ref})=R_2(T_{ref})$, and the resistor bridge 402b may be balanced.

Figure 9B:
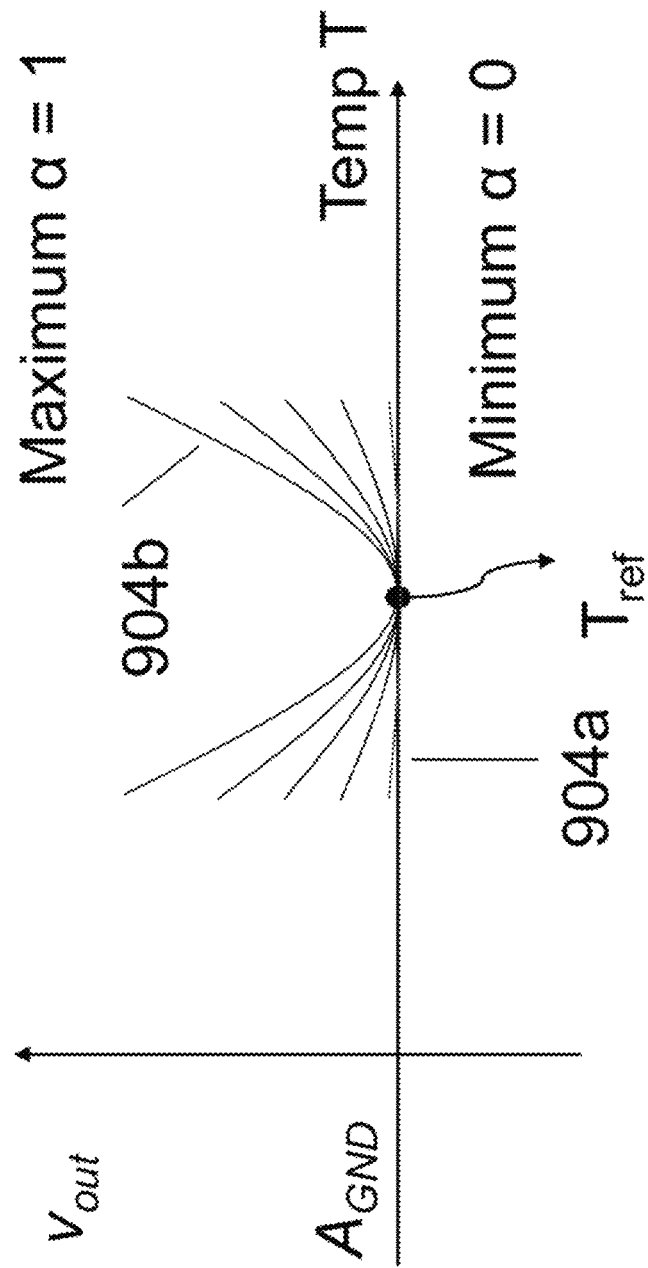
FIG. 9B is a plot of output voltage ($v_{out}$) as a function of temperature (T) illustrating how the relationship between the output voltage and temperature, i.e. the overall second order temperature coefficient of sensitivity or TCS2, varies with scale factor $\alpha$ in the circuit arrangement shown in FIG. 7 according to various embodiments.

FIG. 9B is a plot of output voltage ($v_{out}$) as a function of temperature (T) illustrating how the relationship between the output voltage and temperature, i.e. the overall second order temperature coefficient of sensitivity or TCS2, varies with scale factor α in the circuit arrangement 700 shown in FIG. 7 according to various embodiments. As the scale factor α is swept between 0≤α<1, the overall second-order temperature coefficient of sensitivity TCS2 may vary between $$0 \le TCS2 \le \left(\frac{G}{4}\right)^2 (TCR1_{R1} - TCR1_{R2})^2.$$

TCS2=0 may be defined by line 904a, while $$TCS2 = \left(\frac{G}{4}\right)^2 (TCR1_{R1} - TCR1_{R2})^2$$

may be defined by line 904b.

Figure 9C:
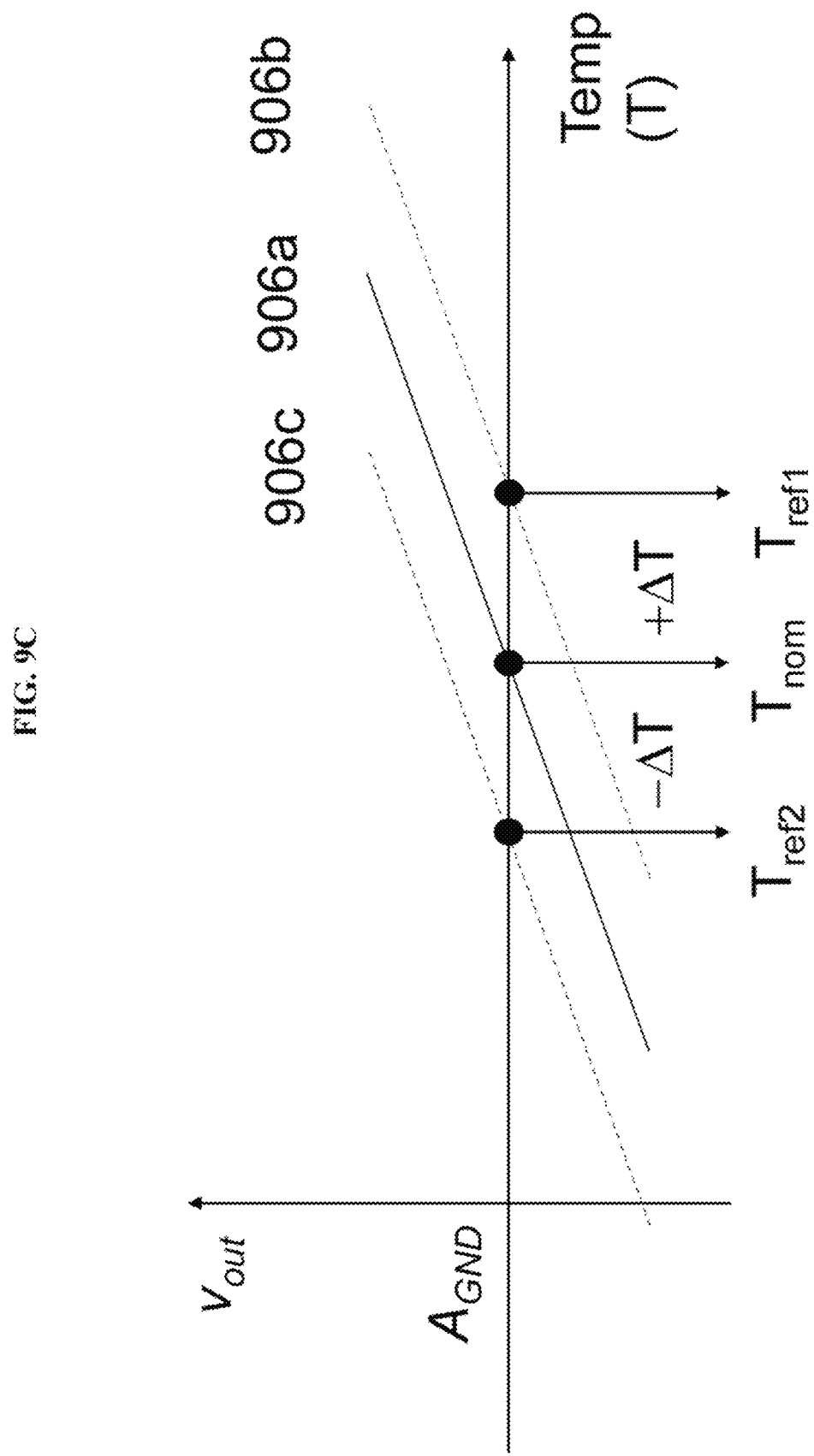
FIG. 9C is a plot of output voltage ($v_{out}$) as a function of temperature (T) illustrating how the relationship between the output voltage and temperature varies by changing resistor value $R_1$ in the resistor bridge of the circuit arrangement shown in FIG. 4D according to various embodiments.

FIG. 9C is a plot of output voltage ($v_{out}$) as a function of temperature (T) illustrating how the relationship between the output voltage and temperature varies by changing resistor value $R_1$ in the adjustable resistor bridge of the circuit arrangement 400 shown in FIG. 4D according to various embodiments.

The temperature coefficient of resistance of $R_2$ may be less than the temperature coefficient of resistance of $R_1$ ($TCR_{R2}<TCR_{R1}$). The relationship between $v_{out}$ and T may be initially be defined by line 906a where $R_1(T_{nom})=R_2(T_{nom})$. If $R_1$ is changed so that $R_1(T_{nom})<R_2(T_{nom})$, then $T_{nom}$ may be shifted to $T_{ref1}$ such that $R_1(T_{ref1})=R_2(T_{ref1})$ defined by line 906b. Conversely, if $R_1$ is adjusted so that $R_1(T_{nom})>R_2(T_{nom})$, then $T_{nom}$ may be shifted to $T_{ref2}$ such that $R_1(T_{ref2})=R_2(T_{ref2})$ defined by line 906c. The magnitude of the shift ΔT may be dependent on the magnitude of the mismatch between $R_1(T_{nom})$ and $R_2(T_{nom})$ in the adjustable resistor bridge.

FIG. 9D is a plot of output voltage ($v_{out}$) as a function of temperature (T) illustrating how the relationship between the output voltage and temperature varies by changing resistor values $R_1$ in the matching adjustable resistor bridges 702b, 752b of the circuit arrangement 700 shown in FIG. 7 according to various embodiments.

The temperature coefficient of resistance of $R_2$ may be less than the temperature coefficient of resistance of $R_1$ ($TCR_{R2}<TCR_{R1}$). The relationship between $v_{out}$ and T may be initially be defined by line 908a where $R_1(T_{nom})=R_2(T_{nom})$. If $R_1$ for the pair of adjustable matching bridges is changed so that $R_1(T_{nom})<R_2(T_{nom})$, then $T_{nom}$ may be shifted to $T_{ref1}$ such that $R_1(T_{ref1})=R_2(T_{ref1})$ defined by line 908b. Conversely, if $R_1$ for the pair of matching bridges is adjusted so that $R_1(T_{nom})>R_2(T_{nom})$, then $T_{nom}$ may be shifted to $T_{ref2}$ such that $R_1(T_{ref2})=R_2(T_{ref2})$ defined by line 908c. The magnitude of the shift ΔT may be dependent on the magnitude of the mismatch between $R_1(T_{nom})$ and $R_2(T_{nom})$ in the matching pair of adjustable resistor bridges.

By permutating the components or circuit arrangements shown in FIG. 4D, FIG. 7, and/or FIG. 8, a circuit arrangement may be formed to realize a quadratic temperature coefficient of sensitivity adjustment of the form $(1+TCS1(T-T_{ref1})+TCS2(T-T_{ref2})^2)v_{dev}$ for driving bridge signal $v_{dev}$. FIG. 10 shows a circuit arrangement 1000 according to various embodiments for realizing a quadratic temperature coefficient of sensitivity adjustment for the bridge driving signal $v_{dev}$.

The circuit arrangement 1000 may include an adjustable resistor bridge 1002b, and an instrumentation amplifier stage 1004. The adjustable resistor bridge 1002b may be configured to receive a driving signal $v_{dev}$ from an electronic device, and further configured to generate one or more intermediate signals $v_p$, $v_r$ based on the driving signal. The instrumentation amplifier stage 1004 may be configured to generate an amplified signal based on the one or more intermediate signals. The circuit arrangement may also include an adjustable scaler 1006 configured to generate an output signal $v_{01}$ based on the amplified signal.

The circuit arrangement 1000 may also include a further resistor bridge 1012b configured to receive the driving signal $v_{dev}$, and further configured to generate one or more further intermediate signals based on the driving signal. The circuit arrangement 1000 may additionally include a further instrumentation amplifier stage 1014 configured to generate a further amplified signal based on the one or more further intermediate signals.

The circuit arrangement 1000 may also include another adjustable resistor bridge 1022b configured to receive the further amplified signal, and further configured to generate one or more other intermediate signals based on the further amplified signal. The circuit arrangement 1000 may further include another instrumentation amplifier stage 1024 configured to generate another amplified signal based on the one or more other intermediate signals. The circuit arrangement 1000 may additionally include a further adjustable scaler 1016 configured to generate a further output signal $v_{o2}$ based on the other amplified signal.

The circuit arrangement 1000 may further include a summer 1018 configured to generate a summed signal $v_{out}$ based on the output signal $v_{o1}$, the further output signal $v_{o2}$, and the driving signal $v_{dev}$. The summed signal $v_{out}$ may be provided by:

$$v_{out} \approx (1 + TCS1(T - T_{ref1}) + TCS2(T - T_{ref2})^2)v_{dev} \qquad (13)$$

The coefficients TCS1, TCS2 and parameters $T_{ref1}$, $T_{ref2}$ may be set independently by digital control signals, i.e. control codes of appropriate word-lengths. The adjustable resistor bridge 1002b may be adjusted by a first resistor stage digital control signal ($T_{ref1}$ Adjustment), and the further adjustable resistor bridge 1012b and the other adjustable resistor bridge 1022b may be adjusted by a common second resistor stage digital control signal ($T_{ref2}$ Adjustment).

The adjustable scaler 1006 may be adjusted by a first scaler digital control signal (TCS1 Adjustment). The further adjustable scaler 1016 may be adjusted by a second scaler digital control signal (TCS2 Adjustment).

While FIG. 10 shows adjustable resistor bridges 1002b, 1012b, 1022b similar to bridge 402b as depicted in FIG. 4B, various embodiments may include any suitable type of adjustable resistor bridge, including the adjustable resistor bridge shown in FIG. 4A. Similarly, while FIG. 10 shows instrumentation amplifier stages 1004, 1014, 1024 similar to the instrumentation amplifier stage 404 shown in FIG. 4D, various embodiments may include any suitable type of amplifier stage such as the amplifier stage 504 shown in FIG. 5A or the amplifier stage 504' shown in FIG. 5B. In addition, the adjustable scalers 906, 916 may be any suitable type of scaler, such as the scaler 600a shown in FIG. 6A or the scaler 600b shown in FIG. 6B.

In various embodiments, a quadratic adjustment of the form $(1+TCS1(T-T_{ref1})+TCS2(T-T_{ref2})^2)$ may be realized for any electronic device whereby the coefficients TCS1, TCS2 and parameters $T_{ref1}$ and $T_{ref2}$ may take on different values.

If the bridge driving signal $v_{dev}$ is replaced by a reference voltage source $V_{REF}$, a quadratic temperature adjustment of the form $(1+TCO1(T-T_{ref1})+TCO2(T-T_{ref2})^2)V_{REF}$ may be realized, where TCO1 is the first-order temperature coefficient of $V_{REF}$ and TCO2 is the second-order temperature coefficient of $V_{REF}$. The coefficients TCO1, TCO2 and parameters $T_{ref1}$, $T_{ref2}$ may be set independently by digital control signals, i.e. control codes of appropriate word-lengths. The temperature adjustment $(1+TCO1(T-T_{ref1})+TCO2(T-T_{ref2})^2)$ on $V_{REF}$ may be used to substantially improve the temperature stability of the reference voltage source $V_{REF}$.

By permutating the components or circuit arrangements shown in FIG. 4D, and/or FIG. 8 with a constant direct current (DC) voltage source, a circuit arrangement may be formed to realize a linear equation in the form $(1+TCS1(T-T_{refS}))v_{dev}+(1+TCO1(T-T_{refO}))V_{offset}$ for bridge driving signal $v_{dev}$. $T_{refS}$ may be the zero-reference temperature point where $R_1(T_{refS})=R_2(T_{refS})$ for signal $v_{dev}$, while $T_{refO}$ may be the zero-reference temperature point where $R_1(T_{refO})=R_2(T_{refO})$ for signal $V_{offset}$. In various embodiments, the coefficients TCS1, TCO1 and parameters $T_{refS}$ and $T_{refO}$ may take on different values to achieve a linear temperature adjustment of sensitivity and offset for bridge driving signal $v_{dev}$.

Figure 11:
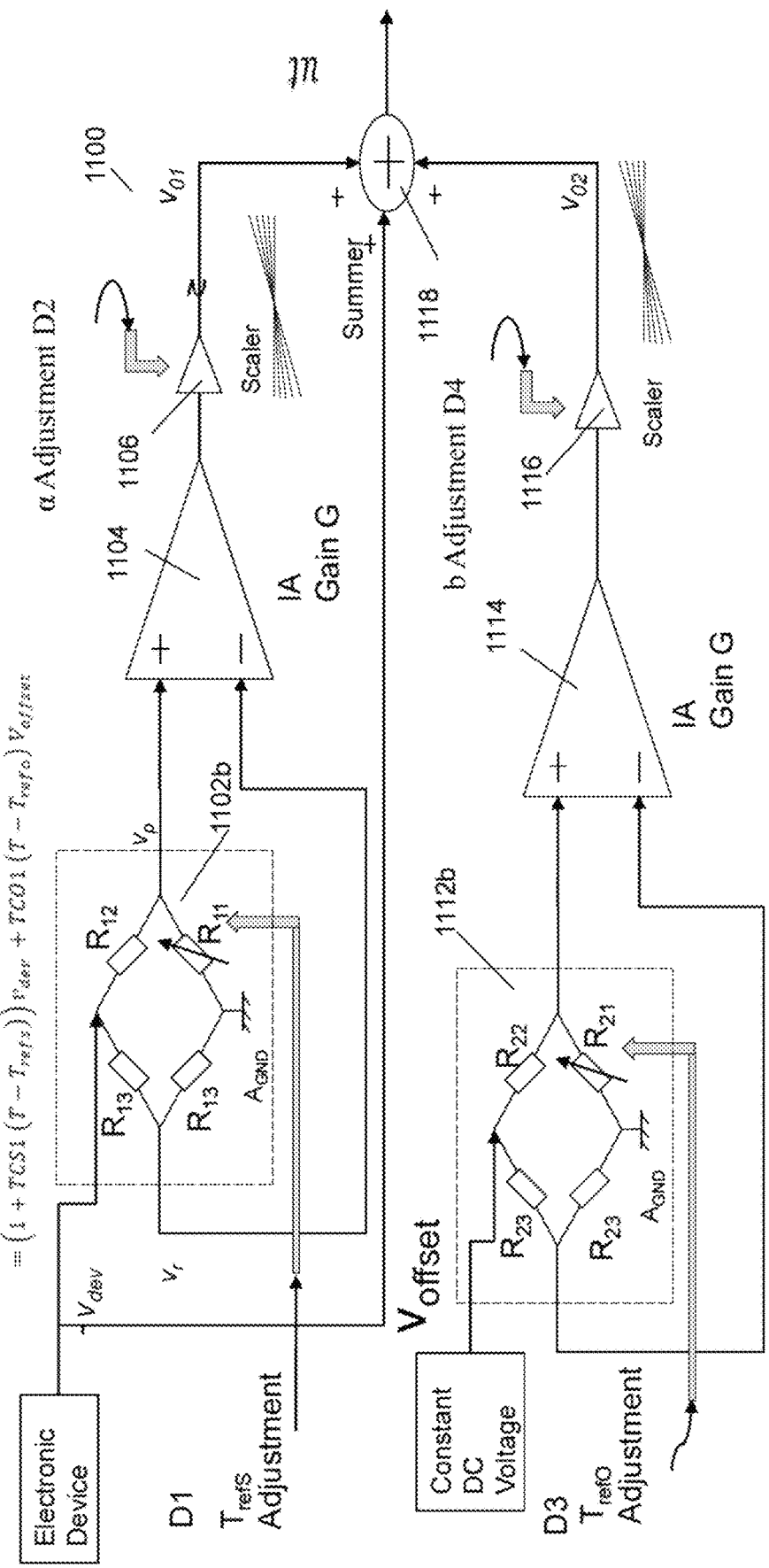
FIG. 11 shows a circuit arrangement according to various embodiments for adjusting a first-order temperature coefficient of sensitivity and a first-order temperature coefficient of offset for the bridge driving signal $v_{dev}$.

FIG. 11 shows a circuit arrangement 1100 according to various embodiments for adjusting a first-order temperature coefficient of sensitivity and a first-order temperature coefficient of offset for bridge driving signal $v_{dev}$.

The circuit arrangement 1100 may include an adjustable resistor bridge 1102b, and an instrumentation amplifier stage 1104. The adjustable resistor bridge 1102b may be configured to receive a driving signal $v_{dev}$ from an electronic device, and further configured to generate one or more intermediate signals $v_p$, $v_r$ based on the driving signal. The instrumentation amplifier stage 1104 may be configured to generate an amplified signal based on the one or more intermediate signals. The circuit arrangement may also include an adjustable scaler 1106 configured to generate an output signal $v_{o1}$ based on the amplified signal.

The circuit arrangement 1100 may include a further adjustable resistor bridge 1112b configured to receive a constant direct current (DC) signal $V_{offset}$, and further configured to generate one or more further intermediate signals based on the constant direct current (DC) signal.

The circuit arrangement 1100 may also include a further instrumentation amplifier stage 1114 configured to generate a further amplified signal based on the one or more further intermediate signals. The circuit arrangement 1100 may additionally include a further adjustable scaler 1116 configured to generate a further output signal $v_{o2}$ based on the further amplified signal.

The circuit arrangement 1100 may further include a summer 1118 configured to generate a summed signal $v_{out}$ based on the driving signal, the output signal $v_{o1}$, and the further output signal $v_{o2}$.

The coefficients TCS1, TCO1 and parameters $T_{refS}$, $T_{refO}$ may be set independently by digital control signals, i.e. control codes of appropriate word-lengths. The adjustable resistor bridge 1102b may be adjusted by a first resistor stage digital control signal, the further adjustable resistor bridge 1112b may be adjusted by a second resistor stage digital control signal, the adjustable scaler 1106 may be adjusted by a first scaler digital control signal, and the further adjustable scaler 1116 may be adjusted by a second scaler digital control signal.

The output voltage may be provided by:

$$v_{out} \approx \left(1 + \alpha\left(\frac{G}{4}\right)(TCR1_{R1} - TCR1_{R2})(T - T_{refS})\right)v_{dev} + \qquad (14)$$

$$b\left(\frac{G}{4}\right)(TCR1_{R1} - TCR1_{R2})(T - T_{refO})V_{offset} =$$

$$(1 + TCS1(T - T_{refS}))v_{dev} + TCO1(T - T_{refO})V_{offset}$$

While FIG. 11 shows adjustable resistor bridges 1102b, 1112b similar to bridge 402b as depicted in FIG. 4B, various embodiments may include any suitable type of adjustable resistor bridge, including the resistor bridge shown in FIG. 4A. Similarly, while FIG. 11 shows instrumentation amplifier stages 1104, 1114 similar to the instrumentation amplifier stage 404 shown in FIG. 4D, various embodiments may include any suitable type of amplifier stage such as the amplifier stage 504 shown in FIG. 5A or the amplifier stage 504' shown in FIG. 5B. In addition, the adjustable scalers 1106, 1116 may be any suitable type of adjustable scaler, such as the scaler 600a shown in FIG. 6A or the scaler 600b shown in FIG. 6B.

By permutating the components or circuit arrangements shown in FIG. 4D, FIG. 7 and/or FIG. 8 with a constant direct current (DC) voltage source, a circuit arrangement may be formed to realize a quadratic equation in the form $(1+TCS1(T-T_{ref1})+TCS2(T-T_{ref2})^2)v_{dev}+(1+TCO1(T-T_{ref3})+TCO2(T-T_{ref4})^2)V_{offset}$ for bridge driving signal $v_{dev}$.

FIG. 12 shows a circuit arrangement 1200 according to various embodiments. In various embodiments, the circuit arrangement 1200 may be suitable for adjusting a first-order and second-order temperature coefficient of sensitivity and a first-order and second-order temperature coefficient of offset for bridge driving signal $v_{dev}$. The circuit arrangement 1200 may include an adjustable resistor bridge 1202b, and an instrumentation amplifier stage 1204. The adjustable resistor bridge 1202b may be configured to receive a driving signal $v_{dev}$ from an electronic device, and further configured to generate one or more intermediate signals based on the driving signal. The instrumentation amplifier stage 1204 may be configured to generate an amplified signal based on the one or more intermediate signals. The circuit arrangement 1200 may also include an adjustable scaler 1206 configured to generate an output signal $v_{o1}$ based on the amplified signal.

The circuit arrangement 1200 may further include a further first adjustable resistor bridge 1212b configured to receive the driving signal, and further configured to generate one or more further first intermediate signals based on the driving signal. The circuit arrangement 1200 may also include a further first instrumentation amplifier stage 1214 configured to generate a further first amplified signal based on the one or more further first intermediate signals. The circuit arrangement 1200 may additionally include a further second adjustable resistor bridge 1222b configured to receive the further first amplified signal, and further configured to generate one or more further second intermediate signals based on the further first amplified signal. The circuit arrangement 1200 may also include a further second instrumentation amplifier stage 1224 configured to receive the one or more further second intermediate signals, and generate a further second amplified signal based on the one or more further second intermediate signals. The circuit arrangement 1200 may additionally include a further first adjustable scaler 1226 configured to generate a further first output signal $v_{o2}$ based on the further second amplified signal.

The circuit arrangement 1200 may also include a first summer 1218 configured to generate a first summed signal based on the output signal $v_{o1}$, the further first output signal $v_{o2}$, and the driving signal.

The circuit arrangement 1200 may additionally include a further third adjustable resistor bridge 1232b configured to receive a constant direct current (DC) signal ($V_{offset}$), and further configured to generate one or more further third intermediate signals based on the constant direct current (DC) signal. The circuit arrangement 1200 may additionally include a further third instrumentation amplifier stage 1234 configured to generate a further third amplified signal based on the one or more further third intermediate signals. The circuit arrangement 1200 may also include a further second adjustable scaler 1236 configured to generate a further second output signal $v_{o3}$ based on the further third amplified signal.

The circuit arrangement 1200 may also include a further fourth adjustable resistor bridge 1242b configured to receive the constant direct current (DC) signal, and further configured to generate one or more further fourth intermediate signals based on the constant direct current (DC) signal. The circuit arrangement 1200 may further include a further fourth instrumentation amplifier stage 1244 configured to generate a further fourth amplified signal based on the one or more further fourth intermediate signals.

The circuit arrangement 1200 may additionally include a further fifth adjustable resistor bridge 1252b configured to receive the further fourth amplified signal, and further configured to generate one or more further fifth intermediate signals based on the further fourth amplified signal. The circuit arrangement 1200 may also include a further fifth instrumentation amplifier stage 1254 configured to generate a further fifth amplified signal based on the one or more further fifth intermediate signals.

The circuit arrangement 1200 may further include a further third adjustable scaler 1256 configured to generate a further third output signal $v_{o4}$ based on the further fifth amplified signal.

The circuit arrangement 1200 may also include a second summer 1248 configured to generate a second summed signal based on the constant direct current (DC) signal, the further second output signal $v_{o3}$, and the further third output signal $v_{o4}$.

The circuit arrangement 1100 may additionally include a third summer 1250 configured to generate a third summed signal $v_{out}$ based on the first summed signal and the second summed signal.

The output voltage may be provided by:

$$v_{out} \approx (1 + TCS1(T - T_{ref1}) + TCS2(T - T_{ref2})^2)v_{dev} + (1 + TC01(T - T_{ref3}) + TC02(T - T_{ref4})^2)V_{offset}$$

Quadratic adjustment in both TCS and TCO in which TCS1, TCS2, TCO1, TCO2 and parameters $T_{ref1}$, $T_{ref2}$, $T_{ref3}$, $T_{ref4}$ may take on different values.

While FIG. 12 shows adjustable resistor bridges 1202b-1252b similar to adjustable bridge 402b as depicted in FIG. 4B, various embodiments may include any suitable type of adjustable resistor bridge, including the adjustable resistor bridge shown in FIG. 4A. Similarly, while FIG. 12 shows instrumentation amplifier stages 1204-1254 similar to the instrumentation amplifier stage 404 shown in FIG. 4D, various embodiments may include any suitable type of amplifier stage such as the amplifier stage 504 shown in FIG. 5A, or the amplifier stage 504' shown in FIG. 5B. In addition, the adjustable scalers 1206, 1226, 1236, 1256 may be any suitable type of adjustable scaler, such as scaler 600a shown in FIG. 6A, or scaler 600b shown in FIG. 6B.

Figure 13:
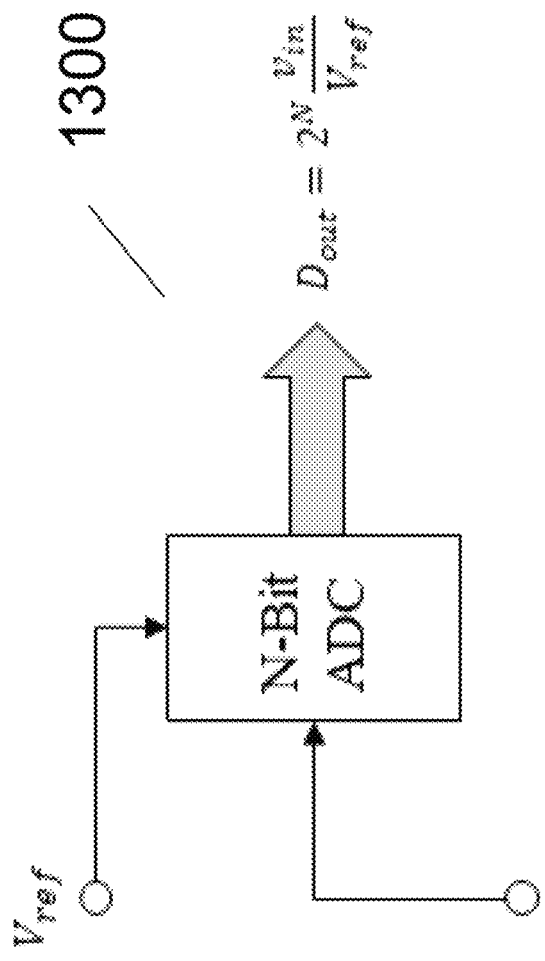
FIG. 13 is a schematic illustrating an analogue-to-digital converter including a circuit arrangement shown in FIG. 10 according to various embodiments to substantially null out a temperature dependence of the input signal $v_{in}$.

FIG. 13 is a schematic illustrating an analogue-to-digital converter 1300 including a circuit arrangement 1000 shown in FIG. 10 according to various embodiments to substantially null out a temperature dependence of the input signal $v_{in}$. In this application, a quadratic temperature coefficient of sensitivity adjustment $(1+TCS1_{Vref}(T-T_{01Vref})+TCS2_{Vref}(T-T_{02Vref})^2)$ may be made to $V_{ref}$ to null out or compensate an arbitrary quadratic dependence on temperature of input voltage $v_{in}$ in an analogue-to-digital conversion process. As the temperature parameters $TCS1_{Vref}$, $T_{01Vref}$, $TCS2_{Vref}$ and $T_{02Vref}$ of the reference voltage source $V_{ref}$ are independently programmable, a temperature stable conversion may be carried out if these are matched to the corresponding temperature parameters of the input signal $v_{in}$.

Various embodiments may provide a circuit for adjusting a temperature characteristics of an electronic device with an analogue output, the circuit including an adjustable resistor bridge comprising at least two types of resistor having different TCR values, driven by the analogue signal, an instrumentation amplifier with gain-setting feedback network to increase the magnitude of the range of the temperature dependent component of the driving signal produced by the adjustable resistor bridge, and an adjustable scaler to adjust the magnitude of the temperature dependent component of the driving signal with a digital control word. In various embodiments, the adjustable bridge may act as a temperature sensor in addition to playing a central part in the adjustment method. There is thus no requirement for a separate temperature sensor.

The temperature coefficient of resistance of resistors included in the adjustable resistor bridge may define the TCS of the signal driving the bridge, as compared to pre-stored memory data in conventional circuits.

The zero-reference temperature $T_{ref}$ associated with the temperature adjustment may be changed from some nominal value by adjusting the adjustable resistor bridge with a digital control word.

The adjustable resistor bridge may be further constructed from resistors having low voltage coefficients of resistance values to reduce or minimize resistor value dependency on applied voltages.

A higher-order temperature dependent component of the bridge driving signal may be derived by a series connection of more than one adjustable resistor bridge. By adjusting the properties of one or more adjustable resistor bridges, a first-order or higher order-TCS for a bridge driving signal may be derived. The higher-order TCS for a bridge driving signal derived by multiple adjustable resistor bridges may be used to substantially eliminate the higher-order temperature nonlinearities produced by a resistor bridge configuration. Thus, a first-order TCS with improved linearity may be derived for the bridge driving signal.

The zero-reference temperature point $T_{ref}$ for TCS may be adjusted by adjusting the values of the resistors in the adjustable resistor bridge. Thus, the mismatch in resistance values due to manufacturing tolerances in integrated circuit (IC) between resistor types having different coefficient of resistance values may be accounted for in the design of the adjustable bridge. The number of bits in the control words required to define the temperature characteristics of the bridge driving signal may be low. Thus, the number of bits to be pre-stored in memory may be low, allowing the use of a memory with low capacity.

The TCS of the bridge driving signal defined by the adjustable resistor bridge may be further increased by a factor of G, where G is the gain of the instrumentation amplifier.

The adjustable scaler may include a buffered digital potentiometer with the magnitude of temperature adjustment monotonic with a resolution set by the resolution of the digital potentiometer.

The resolution of temperature adjustment may be set by the resolution of the adjustable scaler and not by pre-stored memory data. With a preferred embodiment of an adjustable scaler as a buffered digital potentiometer, the position of the tap of the potentiometer may be set by an n-bit digital number, resulting in monotonic temperature adjustment with a resolution of n-bits.

The resistors included in the adjustable resistor bridge may be chosen to have low voltage coefficients of resistance values, in order to reduce or minimize resistor value dependency on applied voltage to prevent degradation of temperature adjustment accuracy provided by the adjustable resistor bridge.

In various embodiments, a quadratic temperature adjustment of the form $(1+TCS1(T-T_{ref})+TCS2(T-T_{ref})^2)$ may be realized for any analogue electronic device, whereby the coefficient TCS1, TCS2 and parameter $T_{ref}$ may take on different values. The quadratic temperature adjustment may be used to substantially eliminate the second-order nonlinearity in the approximate first-order temperature characteristic of the driving signal. A first-order temperature component of the driving signal with improved linearity may be derived.

In various embodiments, a quadratic temperature adjustment of the form $(1+TCS1(T-T_{ref1})+TCS2(T-T_{ref2})^2)$ may be realized for an electronic device whereby the coefficients TCS1, TCS2 and parameters $T_{ref1}$, $T_{ref2}$ may take on different values.

In various embodiments, if the driving signal is replaced by a constant direct current (DC) input source $V_{offset}$, a quadratic temperature adjustment of offset in the form $(1+TCO1(T-T_{ref1})+TCO2(T-T_{ref2})^2)V_{offset}$ may be realized whereby the coefficients TCO1, TCO2 and parameter $T_{ref}$ may take on different values.

In various embodiments, a quadratic adjustment in TCS and TCO may be carried out on an electronic device with an analogue output $v_{dev}$ in the form $v_{out} \approx (1+TCS1(T-T_{ref1})+TCS2(T-T_{ref2})^2)v_{dev}+(1+TCO1(T-T_{ref3})+TCO2(T-T_{ref4})_2)V_{offset}$, whereby the coefficients TCS1, TCS2, TCO1, TCO2 and parameters $T_{ref1}$, $T_{ref2}$, $T_{ref3}$, $T_{ref4}$ may take on different values.

In various embodiments, a quadratic adjustment of the form $(1+a(T-T_{ref1})+b(T-T_{ref2})^2)$ may be applied to a DC input voltage to produce a temperature stable voltage reference $V_{ref}$.

In various embodiments, a quadratic adjustment of the form $(1+a(T-T_{ref1})+b(T-T_{ref2})^2)$ may be applied to a DC input voltage to produce a voltage reference $V_{ref}$ with an arbitrary first and second order temperature characteristics in place of a voltage reference $V_{ref}$ with a constant temperature characteristics.

In various embodiments, the resistors in the adjustable bridge having differing TCR values may be replaced by resistors having differing voltage coefficient of resistance (VCR) values or differing coefficients of resistance in relation to another environmental condition. If the resistors are replaced by resistors of differing VCR values, an adjustment in the characteristics of the bridge signal driving in relation to voltage may be carried out similar to what is described herein. Similarly, if the resistors are replaced by resistors of differing coefficients of resistance values in relation to another environmental condition, an adjustment in characteristics of the bridge driving signal in relation to this other environmental condition may be carried out similar to what is described herein.

The environment condition may be any one selected from a group consisting of temperature, a voltage of the driving signal, intensity of incident radiation (e.g. light or any other suitable type of electromagnetic wave), magnetic field strength, mechanical strain, and humidity. The environmental condition may not be limited to the abovementioned examples, but may be any other suitable environmental condition.

By changing the values of resistors in the adjustable resistor bridge with a digital control word, the zero-reference temperature of the temperature trimming may be varied. By changing the gain of the adjustable scaler with another digital control word, the magnitude of the temperature trim may be varied independently from the zero-reference temperature adjustment.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A circuit arrangement comprising:
    an adjustable resistor bridge configured to receive one or more driving signals from an electronic device, and further configured to generate one or more intermediate signals based on the one or more driving signals;
    an amplifier stage configured to generate an amplified signal based on the one or more intermediate signals; and
    a scaler configured to generate an output signal based on the amplified signal;
    wherein the adjustable resistor bridge comprises at least one resistor of a first resistor type having a first coefficient of resistance with respect to an environmental condition;
    wherein the adjustable resistor bridge comprises at least one resistor of a second resistor type having a second coefficient of resistance with respect to the environmental condition different from the first coefficient; and
    wherein a resistance of the at least one resistor of the first resistor type is adjustable by a resistor stage digital control signal.

2. The circuit arrangement according to claim 1,
    wherein the environmental condition is any one selected from a group consisting of temperature, a voltage of the driving signal, intensity of incident radiation, magnetic field strength, mechanical strain, and humidity.

3. The circuit arrangement according to claim 1,
    wherein the adjustable resistor bridge is a single-ended bridge comprising:
        an adjustable first branch comprising a resistor of the at least one resistor of the first resistor type and a resistor of the at least one resistor of the second resistor type in serial connection with each other;
        a second branch connected in parallel to the first branch, the second branch comprising further two resistors of the at least one resistor of the second resistor type in serial connection with each other;
    wherein a driving signal of the one or more driving signals is received by a connection point connecting the adjustable first branch and the second branch;
    wherein the single-ended bridge is configured to generate a first intermediate signal of the one or more intermediate signals at a further connection point connecting the resistor of the first resistor type comprised in the adjustable first branch, and the resistor of the second resistor type comprised in the adjustable first branch; and
    wherein the single-ended bridge is configured to generate a second intermediate signal of the one or more intermediate signals at another connection point connecting the further two resistors of the second resistor type comprised in the second branch.

4. The circuit arrangement according to claim 1,
    wherein the adjustable resistor bridge is a single-ended bridge comprising:
        an adjustable first branch comprising a resistor of the at least one resistor of the first resistor type and a resistor of the at least one resistor of the second resistor type in serial connection with each other;
        a second branch connected in parallel to the first branch, the second branch comprising two resistors of a third resistor type in serial connection with each other;
    wherein a driving signal of the one or more driving signals is received by a connection point connecting the adjustable first branch and the second branch;
    wherein the single-ended bridge is configured to generate a first intermediate signal of the one or more intermediate signals at a further connection point connecting the resistor of the first resistor type comprised in the adjustable first branch, and the resistor of the second resistor type comprised in the adjustable first branch; and
    wherein the single-ended bridge is configured to generate a second intermediate signal of the one or more intermediate signals at another connection point connecting the two resistors of the third resistor type comprised in the second branch.

5. The circuit arrangement according to claim 1,
    wherein the adjustable resistor bridge is a differential bridge comprising:
        a first branch comprising a resistor of the at least one resistor of the first resistor type and a resistor of the at least one resistor of the second resistor type in serial connection with each other;
        a second branch connected in parallel to the first branch, the second branch comprising a further resistor of the at least one resistor of the first resistor type and a further resistor of the at least one resistor of the second resistor type in serial connection with each other;
    wherein a first driving signal of the one or more driving signals is received by a first connection point connecting the first branch and the second branch, and a second driving signal of the one or more driving signals is received by a second connection point connecting the first branch and the second branch;
    wherein the differential bridge is configured to generate a first intermediate signal of the one or more intermediate signals at a further connection point connecting the resistor of the first resistor type comprised in the first branch, and the resistor of the second resistor type comprised in the first branch; and
    wherein the differential bridge is configured to generate a second intermediate signal of the one or more intermediate signals at another connection point connecting the further resistor of the first resistor type, and the further resistor of the second resistor type comprised in the second branch.

6. The circuit arrangement according to claim 1,
    wherein the resistance of the at least one resistor of the first resistor type is adjustable so that a relationship between the output signal and the environmental condition is adjustable.

7. The circuit arrangement according to claim 1,
wherein the scaler is an adjustable scaler adjustable by a scaler digital control signal.

8. The circuit arrangement according to claim 7,
wherein the adjustable scaler is a digital potentiometer.

9. The circuit arrangement according to claim 1,
wherein the amplifier stage comprises:
an instrumentation amplifier configured to receive a first intermediate signal of the one or more intermediate signals from the adjustable resistor bridge, and further configured to receive a second intermediate signal of the one or more intermediate signals from the adjustable resistor bridge;
wherein the instrumentation amplifier comprises an output configured to generate the amplified signal based on the difference between the first and second intermediate signals.

10. The circuit arrangement according to claim 1, further comprising:
a further adjustable resistor bridge configured to receive the amplified signal, and further configured to generate one or more further intermediate signals based on the amplified signal; and
a further amplifier stage configured to generate a further amplified signal based on the one or more further intermediate signals;
wherein the scaler is configured to generate the output signal based on the further amplified signal.

11. The circuit arrangement according to claim 1, further comprising:
a further adjustable resistor bridge configured to receive the amplified signal, and further configured to generate one or more further intermediate signals based on the amplified signal; and
a further amplifier stage configured to generate a further amplified signal based on the one or more further intermediate signals;
a further scaler configured to generate a second order correction signal based on the further amplified signal;
a summer having a first input configured to receive the amplified signal from the amplifier stage, a second input configured to receive the second order correction signal from the further scaler, and an output configured to generate a summed signal based on the amplified signal and the second order correction signal;
wherein the scaler is configured to generate the output signal based on the summed signal.

12. The circuit arrangement according to claim 1, further comprising:
a further adjustable resistor bridge configured to receive the driving signal, and further configured to generate one or more further intermediate signals based on the driving signal;
a further amplifier stage configured to generate a further amplified signal based on the one or more further intermediate signals;
another adjustable resistor bridge configured to receive the further amplified signal, and further configured to generate one or more other intermediate signals based on the further amplified signal;
another amplifier stage configured to generate another amplified signal based on the one or more other intermediate signals;
a further scaler configured to generate a further output signal based on the other amplified signal; and
a summer configured to generate a summed signal based on the output signal, the further output signal, and the driving signal.

13. The circuit arrangement according to claim 12,
wherein the adjustable resistor bridge is adjustable by a first resistor stage digital control signal;
wherein the further adjustable resistor bridge and the other adjustable resistor bridge are adjustable by a second resistor stage digital control signal;
wherein the scaler is adjustable by a first scaler digital control signal; and
wherein the further scaler is adjustable by a second scaler digital control signal.

14. The circuit arrangement according to claim 1, further comprising:
a further adjustable resistor bridge configured to receive a constant direct current (DC) signal, and further configured to generate one or more further intermediate signals based on the constant direct current (DC) signal;
a further amplifier stage configured to generate a further amplified signal based on the one or more further intermediate signals;
a further scaler configured to generate a further output signal based on the further amplified signal; and
a summer configured to generate a summed signal based on the driving signal, the output signal, and the further output signal.

15. The circuit arrangement according to claim 14,
wherein the adjustable resistor bridge is adjustable by a first resistor stage digital control signal;
wherein the further adjustable resistor bridge is adjustable by a second resistor stage digital control signal;
wherein the scaler is adjustable by a first scaler digital control signal; and
wherein the further scaler is adjustable by a second scaler digital control signal.

16. The circuit arrangement according to claim 1, further comprising:
a further first adjustable resistor bridge configured to receive the driving signal, and further configured to generate one or more further first intermediate signals based on the driving signal;
a further first amplifier stage configured to generate a further first amplified signal based on the one or more further first intermediate signals;
a further second adjustable resistor bridge configured to receive the further first amplified signal, and further configured to generate one or more further second intermediate signals based on the further first amplified signal;
a further second amplifier stage configured to receive the one or more further second intermediate signals, and generate a further second amplified signal based on the one or more further second intermediate signals;
a further first scaler configured to generate a further first output signal based on the further second amplified signal;
a first summer configured to generate a first summed signal based on the output signal, the further first output signal, and the driving signal;
a further third adjustable resistor bridge configured to receive a constant direct current (DC) signal, and further configured to generate one or more further third intermediate signals based on the constant direct current (DC) signal;

a further third amplifier stage configured to generate a further third amplified signal based on the one or more further third intermediate signals;

a further second scaler configured to generate a further second output signal based on the further third amplified signal;

a further fourth adjustable resistor bridge configured to receive the constant direct current (DC) signal, and further configured to generate one or more further fourth intermediate signals based on the constant direct current (DC) signal;

a further fourth amplifier stage configured to generate a further fourth amplified signal based on the one or more further fourth intermediate signals;

a further fifth adjustable resistor bridge configured to receive the further fourth amplified signal, and further configured to generate one or more further fifth intermediate signals based on the further fourth amplified signal;

a further fifth amplifier stage configured to generate a further fifth amplified signal based on the one or more further fifth intermediate signals;

a further third scaler configured to generate a further third output signal based on the further fifth amplified signal;

a second summer configured to generate a second summed signal based on the constant direct current (DC) signal, the further second output signal, and the further third output signal; and a third summer configured to generate a third summed signal based on the first summed signal and the second summed signal.

17. The circuit arrangement according to claim 16, wherein the adjustable resistor bridge is adjustable by a first resistor stage digital control signal;

wherein the further first adjustable resistor bridge and the further second adjustable resistor bridge are adjustable by a second resistor stage digital control signal;

wherein the further third adjustable resistor bridge is adjustable by a third resistor stage control signal;

wherein the further fourth adjustable resistor bridge and the further fifth adjustable resistor bridge are adjustable by a fourth resistor stage digital control signal;

wherein the scaler is adjustable by a first scaler digital control signal;

wherein the further first scaler is adjustable by a second scaler digital control signal;

wherein the further second scaler is adjustable by a third scaler digital control signal; and wherein the further third scaler is adjustable by a fourth scaler digital control signal.

18. A method of forming a circuit arrangement, the method comprising:

providing an adjustable resistor bridge configured to receive one or more driving signals from an electronic device, and further configured to generate one or more intermediate signals based on the one or more driving signals;

coupling an amplifier stage such that the amplifier stage is configured to generate an amplified signal based on the one or more intermediate signals; and coupling a scaler such that the scaler is configured to generate an output signal based on the amplified signal;

wherein the adjustable resistor bridge comprises at least one resistor of a first resistor type having a first coefficient of resistance with respect to an environmental condition;

wherein the adjustable resistor bridge comprises at least one resistor of a second resistor type having a second coefficient of resistance with respect to the environmental condition different from the first coefficient; and wherein a resistance of the at least one resistor of the first resistor type is adjustable by a resistor stage digital control signal.

19. The method according to claim 18, wherein the environmental condition is any one selected from a group consisting of temperature, a voltage of the driving signal, intensity of incident radiation, magnetic field strength, mechanical strain, and humidity.

* * * * *